United States Patent [19]
Hashimoto et al.

[11] Patent Number: 6,027,983
[45] Date of Patent: Feb. 22, 2000

[54] METHOD OF MANUFACTURING TRENCH ISOLATE SEMICONDUCTOR INTEGRATED CIRCUIT DEVICE

[75] Inventors: Takashi Hashimoto; Yoshifumi Ohnishi; Toshiyuki Kikuchi, all of Ohme, Japan

[73] Assignee: Hitachi, Ltd., Tokyo, Japan

[21] Appl. No.: 08/455,139

[22] Filed: May 31, 1995

[30] Foreign Application Priority Data

Jun. 2, 1994 [JP] Japan .................................. 6-120894

[51] Int. Cl.⁷ .................................................. H01L 21/762
[52] U.S. Cl. .......................... 438/426; 438/437; 438/702
[58] Field of Search ............... 437/62, 67; 148/DIG. 50, 148/DIG. 85, DIG. 86; 438/425, 426, 424, 437, FOR 227, 702, 978, FOR 458, FOR 492

[56] References Cited

U.S. PATENT DOCUMENTS

| | | |
|---|---|---|
| 4,835,115 | 5/1989 | Eklund . |
| 5,099,304 | 3/1992 | Takemura et al. ........................ 437/67 |
| 5,106,777 | 4/1992 | Rodder ..................................... 437/67 |
| 5,468,676 | 11/1995 | Madan ..................................... 437/67 |
| 5,470,782 | 11/1995 | Schwalke et al. . |

FOREIGN PATENT DOCUMENTS

| | | |
|---|---|---|
| 0482591 | 4/1992 | European Pat. Off. . |
| 0630043 | 12/1994 | European Pat. Off. . |
| 58-143548 | 8/1983 | Japan . |
| 60-58636 | 4/1985 | Japan . |
| 60-124841 | 7/1985 | Japan . |
| 60-140818 | 7/1985 | Japan . |
| 61-91928 | 5/1986 | Japan . |
| 61-159737 | 7/1986 | Japan . |
| 61-198745 | 9/1986 | Japan . |
| 61-207029 | 9/1986 | Japan . |
| 62-147743 | 7/1987 | Japan . |
| 2-105552 | 4/1990 | Japan . |
| 2-156552 | 6/1990 | Japan . |
| 3-149849 | 6/1991 | Japan . |
| 3-234041 | 10/1991 | Japan . |
| 4-209551 | 7/1992 | Japan . |
| 4-259239 | 9/1992 | Japan . |
| 5-121379 | 5/1993 | Japan . |
| 5-166823 | 7/1993 | Japan . |
| 5-166921 | 7/1993 | Japan . |
| 6-85051 | 3/1994 | Japan . |
| WO85/04516 | 10/1985 | WIPO . |

OTHER PUBLICATIONS

Wolf, S., "Silicon Processing for the VLSI Era, vol. 2, Process Integration", Lattice Press, 1990, pp. 71–72.

*Primary Examiner*—George Fourson
*Attorney, Agent, or Firm*—Antonelli, Terry, Stout & Kraus, LLP

[57] ABSTRACT

A method of manufacturing a semiconductor integrated circuit device according to this invention, comprises a step of forming in a semiconductor substrate a deep groove for trench isolation with an aspect ratio of greater than 1, a step of burying a first insulating film in the deep groove in such a way that a shallow groove with an aspect ratio of not greater than 1 remains, and a step of depositing a second insulating film over the semiconductor substrate and then removing the upper portion of the second insulating film to planarize the upper surface of the second insulating film buried in the shallow groove in such a way that the upper surface of the second insulating film is almost flush with the surface surrounding the shallow groove.

41 Claims, 23 Drawing Sheets

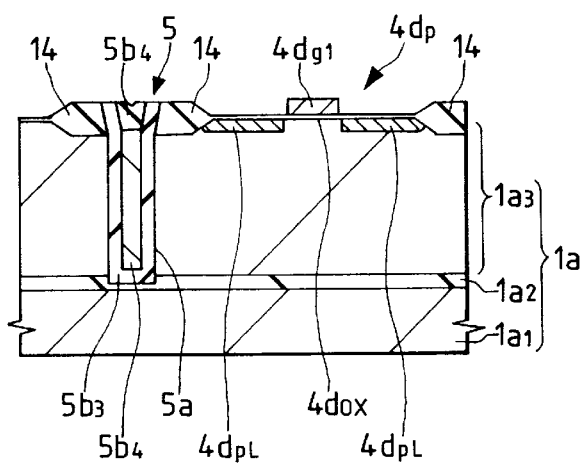
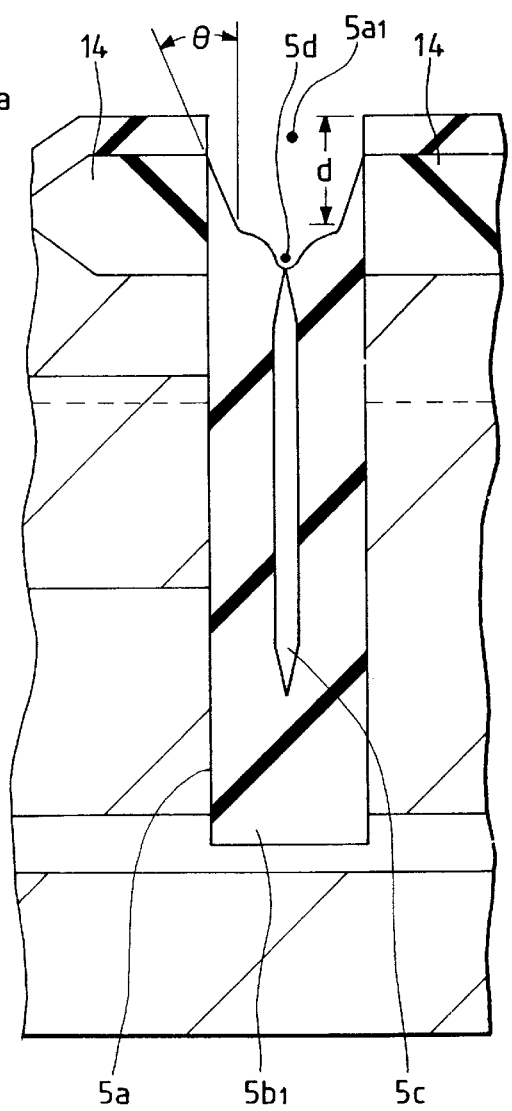

METHOD OF MANUFACTURING TRENCH ISOLATE SEMICONDUCTOR INTEGRATED CIRCUIT DEVICE

BACKGROUND OF THE INVENTION

The present invention relates to a method of manufacturing a semiconductor integrated circuit device and more specifically to a semiconductor integrated circuit device manufacturing method having a process of forming a trench isolation.

The trench isolation is an element isolating part in a semiconductor substrate, which electrically isolates adjoining semiconductor integrated circuit elements by filling a groove formed between adjacent semiconductor integrated circuit elements with a specified burying material.

An example method of forming trench isolation examined by the inventor of this invention will be described below. After a groove is formed in a semiconductor substrate, an insulating film is formed on the inner surface of the groove. Then, a polycrystalline silicon film is deposited on the semiconductor substrate, after which the polysilicon film is etched back to fill only the groove with the polysilicon. After this, the semiconductor substrate is oxidized to oxidize the upper part of the polysilicon film in the groove, thus transforming the upper part into an insulating film.

An example method of burying an insulating film in the groove is disclosed in Japanese Patent Laid-Open No.143548/1983. The outline of this method is as follows. First, a side wall of an insulating film is formed on the inner wall surface of the groove to form a tapered surface on the inner wall surface of the groove, after which a burying insulating film is deposited over the semiconductor substrate. Next, the burying insulating film is etched back to bury the insulating film only in the groove.

SUMMARY OF THE INVENTION

The inventor of this invention, however, has found that the conventional art involves the following problems.

In the conventional art, by which a groove is filled with a polysilicon film and the upper part of the film is oxidized to ensure the insulating properties of the upper part of the polysilicon film in the groove, because there is a difference in the oxidation rate of the polysilicon film in the groove between the periphery of the groove and the center, the thickness of the insulating film formed at the top of the polysilicon film is thinner at the groove periphery than at the central portion. As a result a recess in formed in the groove periphery, and in the subsequent process of forming conductor patterns, conductor film residue tends to remain in a recessed central part of the groove, leading to a short circuit between patterned conductors.

A conventional technique to solve this problem is proposed in Japanese Patent Laid-Open No. 149849/1991, which discloses a method of forming an insulating film to ensure the flatness of the top part of the polysilicon film before and after oxidizing the top part of the polysilicon film in the groove. This method, however, requires an additional process for forming an insulating film for ensuring the flatness.

The conventional technique of burying an insulating film in the groove is effective for the grooves with an aspect ratio of less than 1. As the aspect ratio becomes larger than 1, a problem arises that a cavity may form in the groove. This cavity is formed because the insulating film in the groove is coarse, the coverage of the groove is bad, and the film is not completely buried in the groove. This cavity appears on the top part of the groove causing a conductor film to remain during the subsequent process for forming a conductor pattern, with the result that the residual conductor film may short-circuit the patterned conductors.

An object of this invention is to provide a technique which allows a deep groove for a trench isolation to be filled completely without forming a dent or recess at the top of the filled groove.

Another object of this invention is to provide a technique which allows a deep groove for a trench isolation to be filled completely without forming a dent or recess at the top of the filled groove and without incurring a significant increase in the number of manufacturing steps.

A further object of this invention is to provide a technique which allows a deep groove for a trench isolation to be filled completely without exposing cavities from the top surface.

A further object of this invention is to provide a method of manufacturing a semiconductor integrated circuit device and more specifically to provide a technique which allows a deep groove for a trench isolation to be filled preferably without exposing cavities from the top surface and incurring a significant increase in the number of manufacturing steps.

These and other objects and novel features of this invention will become apparent from the following description in this specification and the accompanying drawings.

Representatives of the invention disclosed in this specification will be briefly summarized below.

A method of manufacturing a semiconductor integrated circuit device according to this invention comprises a step of forming in a semiconductor substrate a deep groove for a trench isolation with an aspect ratio larger than 1, a step of burying a first insulating film in the deep groove so that a shallow groove with an aspect ratio of not greater than 1 remains in the deep groove, and a step of depositing a second insulating film over the semiconductor substrate and removing an upper part of the second insulating film to planarize the upper part of the second insulating film buried in the shallow groove.

Further, a method of manufacturing a semiconductor integrated circuit device according to this invention forms a recess at the central part of the top surface of the first insulating film buried in the deep groove.

Further, a method of manufacturing a semiconductor integrated circuit device according to this invention comprises a step of forming in a semiconductor substrate a deep groove for a trench isolation with an aspect ratio larger than 1, a step of forming an insulating film on an inner wall surface of the deep groove and burying a semiconductor in the deep groove so that a shallow groove with an aspect ratio of not greater than 1 remains in the deep groove, and a step of depositing a second insulating film over the semiconductor substrate and removing the upper part of the second insulating film to planarize the upper part of the second insulating film buried in the shallow groove.

Further, the method of manufacturing a semiconductor integrated circuit device according to this invention forms a tapered portion in the opening portion of the deep groove.

According to the above-mentioned method of manufacturing a semiconductor integrated circuit device of this invention, the step of filling a deep groove for a trench isolation with a high aspect ratio is divided into two steps. In the first filling step, the deep groove is turned into a shallow groove by filling the deep groove to a specified extent to lower the aspect ratio. In the second filling step, the shallow groove is filled and the upper part of the filling material in the shallow groove is planarized. These steps makes it possible to fill a deep groove preferably without causing cavities to appear on the upper part of the deep groove, without forming a recess in the outer periphery of the upper part of the deep groove, and without incurring a significant increase in the number of manufacturing steps.

Further, according to the above-mentioned method of manufacturing a semiconductor integrated circuit device of this invention, by forming a recess in the central portion of the upper surface of the first insulating film buried in the deep groove, a certain thickness of the second insulating film buried in the shallow groove can be ensured at the central upper part of the first insulating film, so that even if a cavity is formed in the center of the first insulating film, it is possible to prevent a large recess or a groove communicating with the cavity in the center of the first insulating film from being formed at the center of the second insulating film.

Further, according to the above-mentioned method of manufacturing a semiconductor integrated circuit device of this invention, a tapered portion is formed in the opening part of the deep groove. This makes it possible to bury a second insulating film in the shallow groove without forming any cavities.

BRIEF DESCRIPTION OF THE DRAWINGS

FIG. 27 is a cross section of an essential portion of the semiconductor substrate in a step, following the step of FIG. 26, of making the semiconductor integrated circuit device of the second embodiment of this invention; and FIG. 28 is an enlarged view of a part of the semiconductor integrated circuit device of FIG. 9.

DESCRIPTION OF THE PREFERRED EMBODIMENTS

The embodiments of the present invention will be described in detail referring to the accompanying drawings.

Embodiment 1

Figure 1:
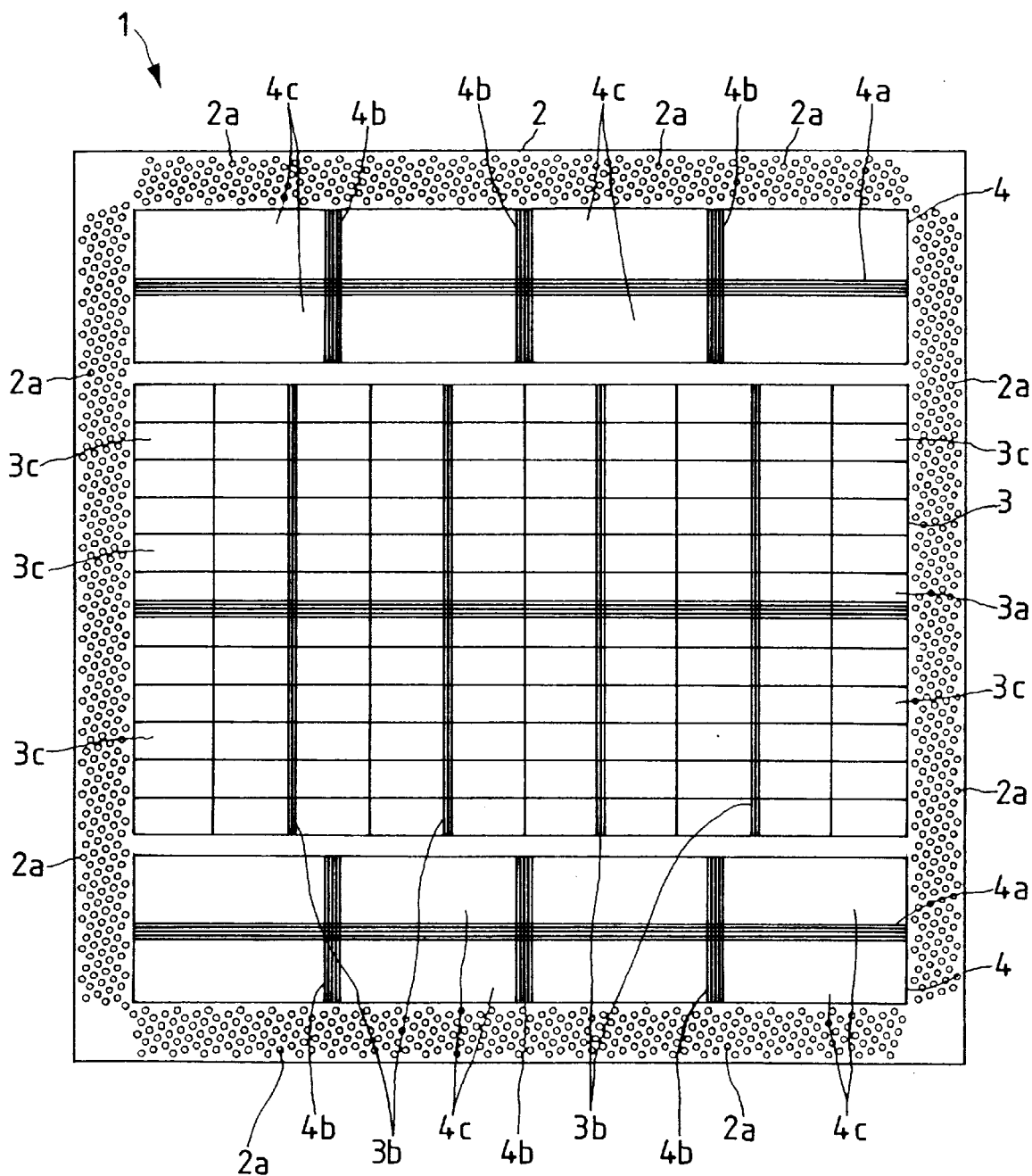
FIG. 1 is an overall plan view of a semiconductor chip that makes up a semiconductor integrated circuit device of a first embodiment of this invention.
Figure 2:
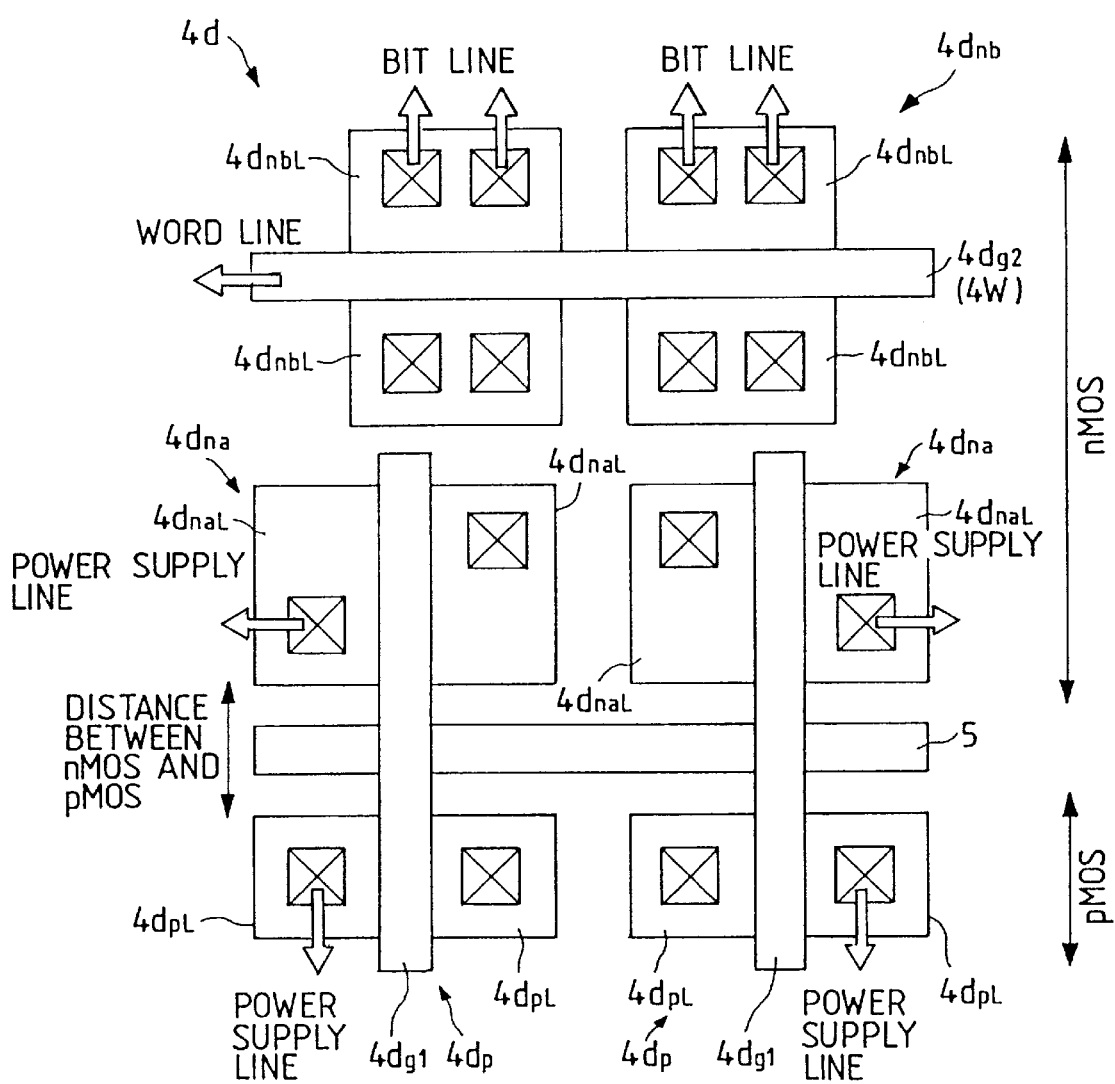
FIG. 2 is a plan view of an essential portion of the semiconductor chip of FIG. 1.
Figure 3:
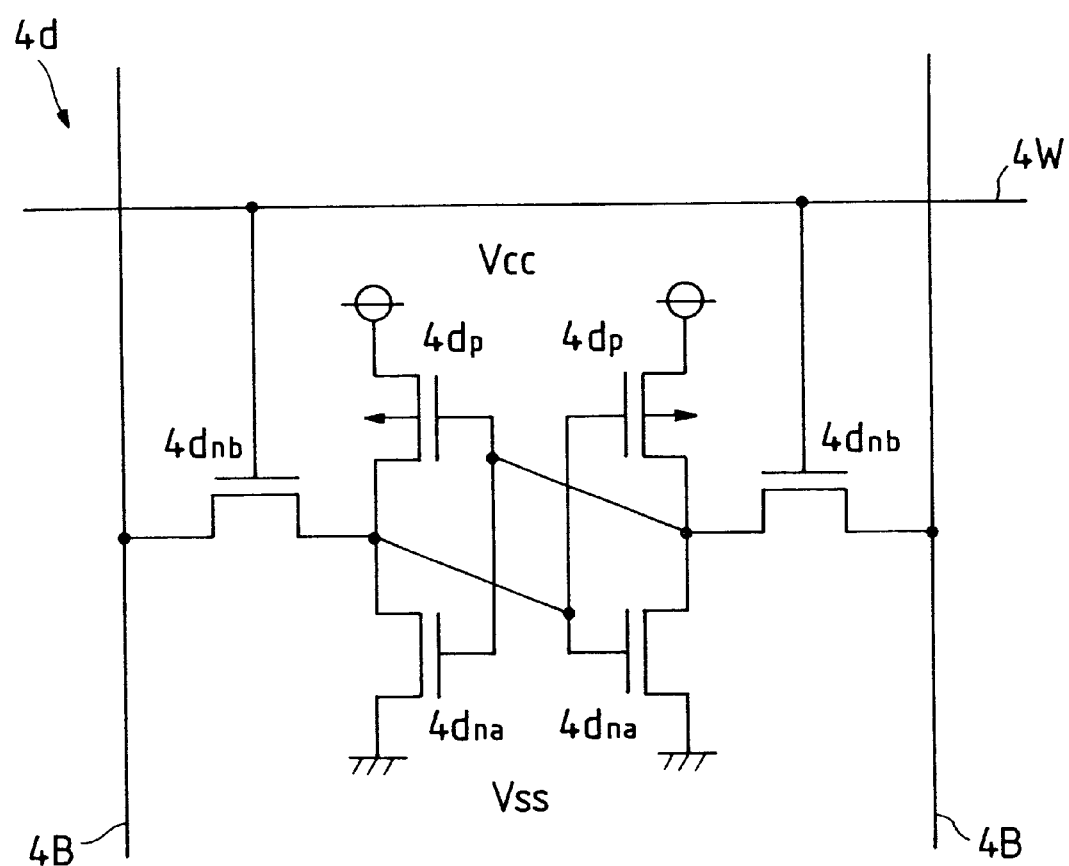
FIG. 3 is a circuit of a memory cell making up the semiconductor integrated circuit device of FIG. 1.
Figure 4:
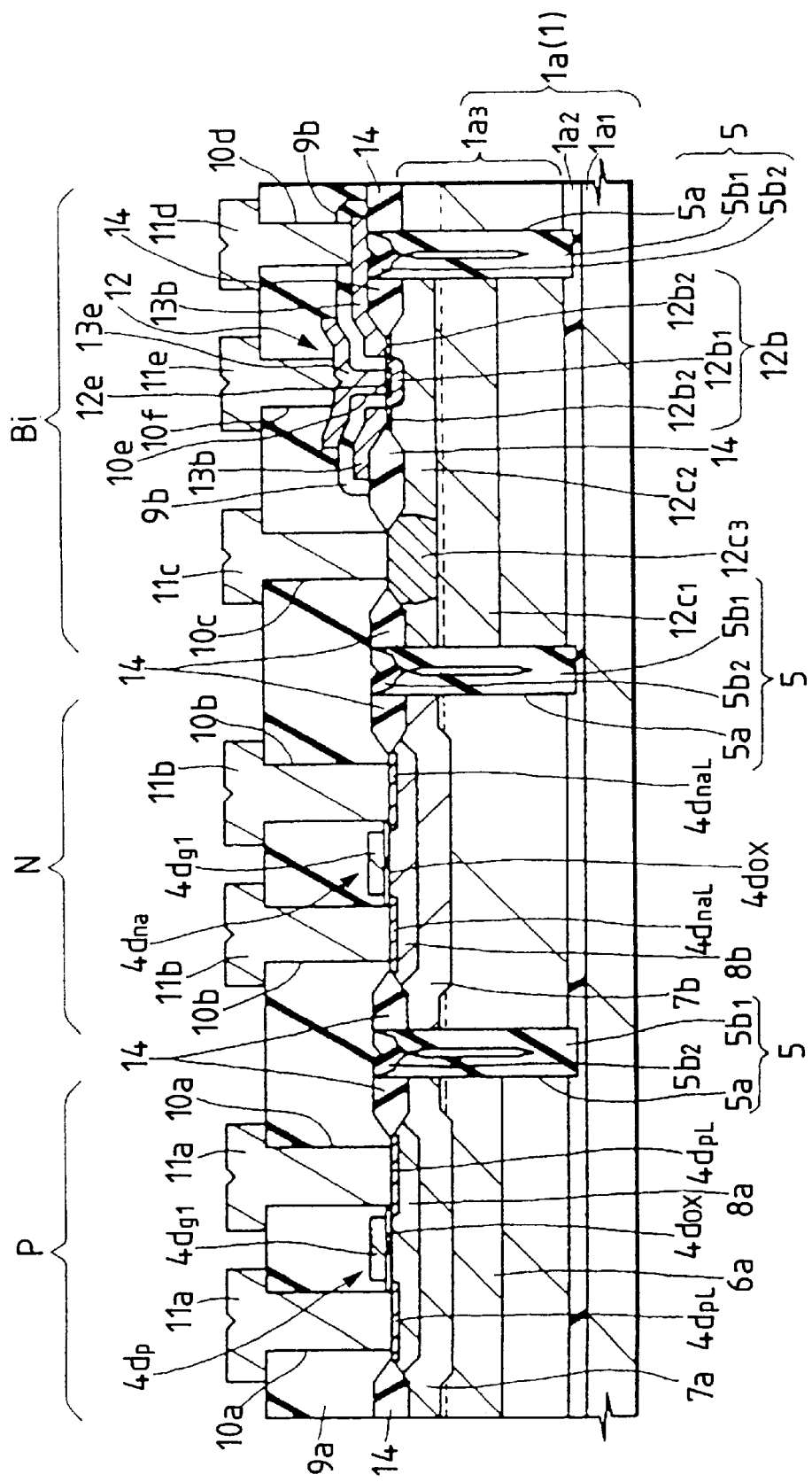
FIG. 4 is a cross section of an essential portion of the semiconductor integrated circuit device of FIG. 1.
Figure 15:
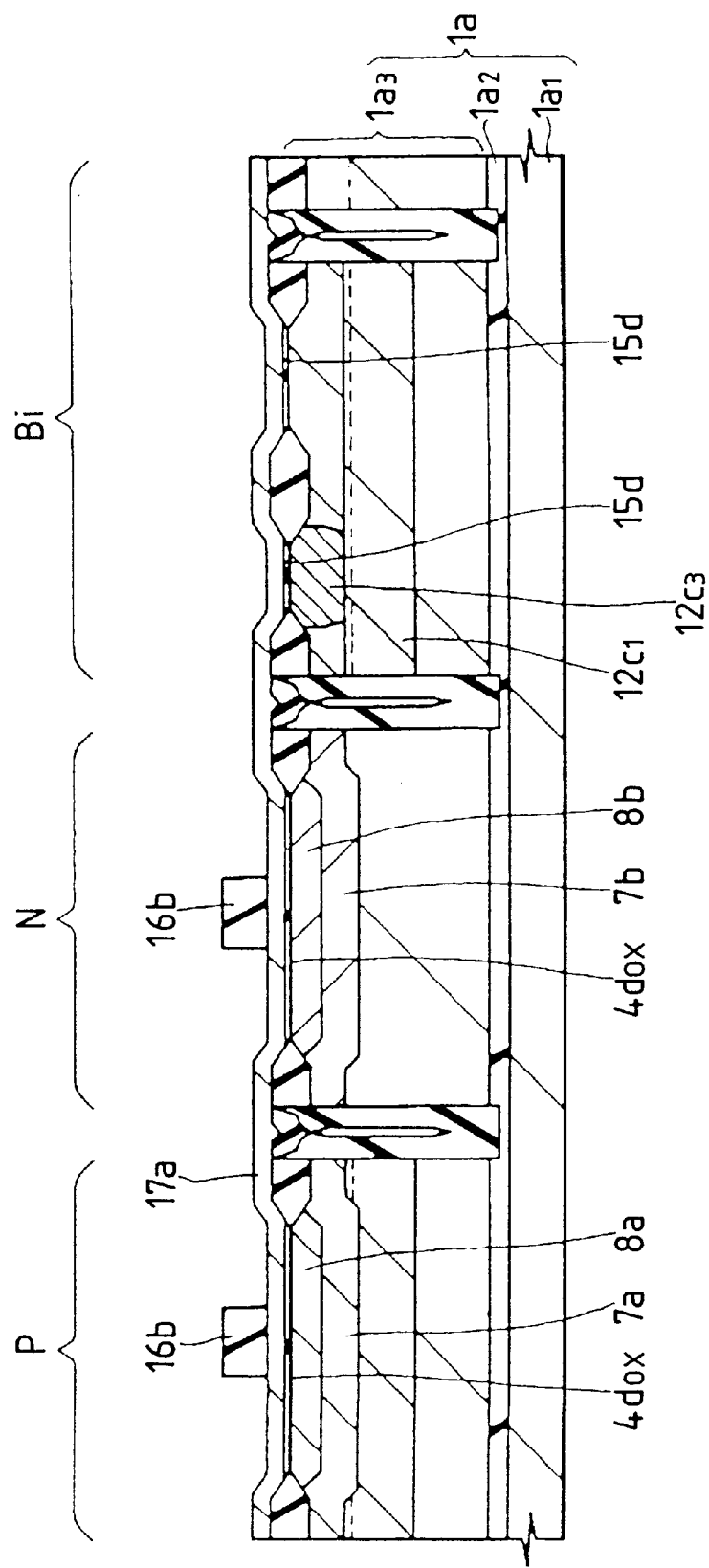
FIG. 15 is a cross section of an essential portion of the semiconductor substrate in a step, following the step of FIG. 14, of making the semiconductor integrated circuit device of the first embodiment of this invention.
Figure 16:
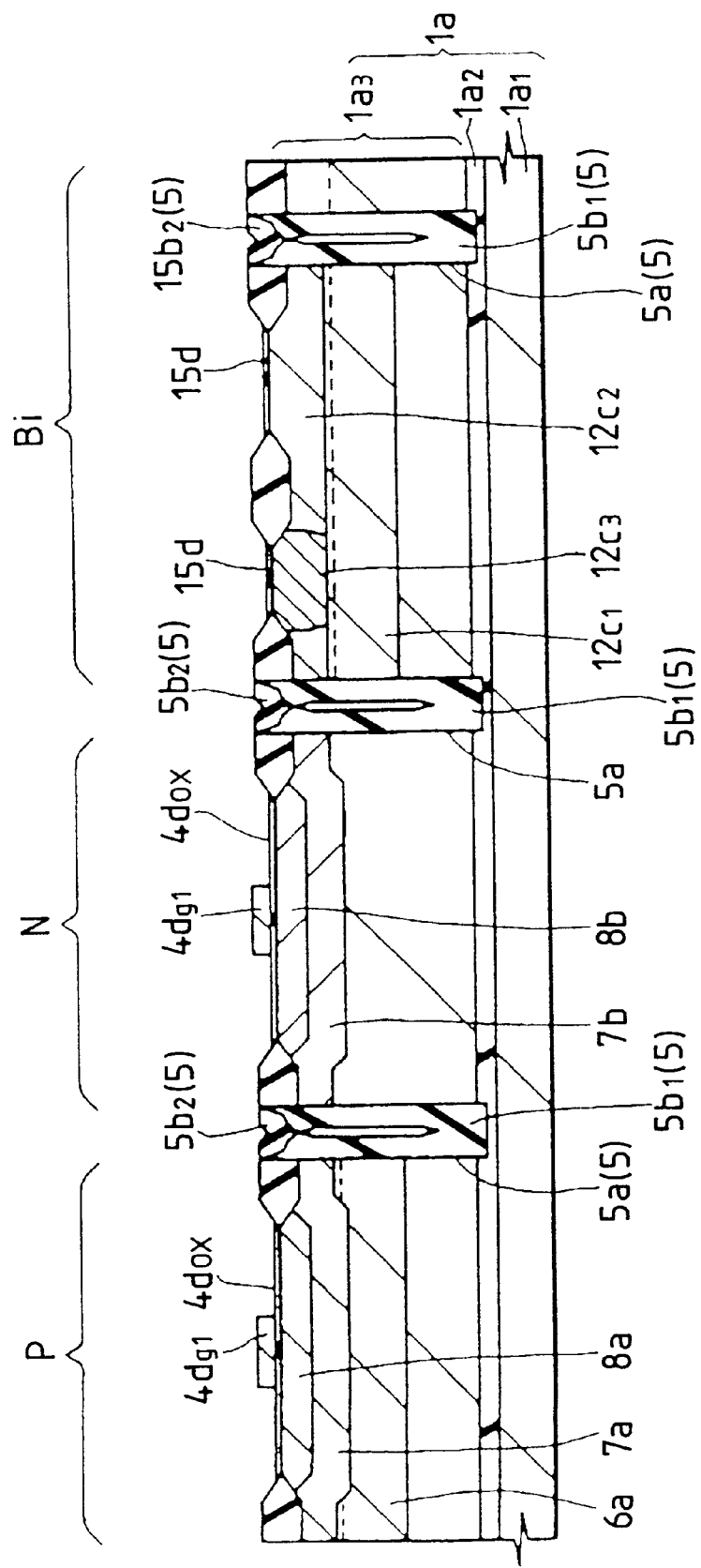
FIG. 16 is a cross section of an essential portion of the semiconductor substrate in a step, following the step of FIG. 15, of making the semiconductor integrated circuit device of the first embodiment of this invention.
Figure 17:
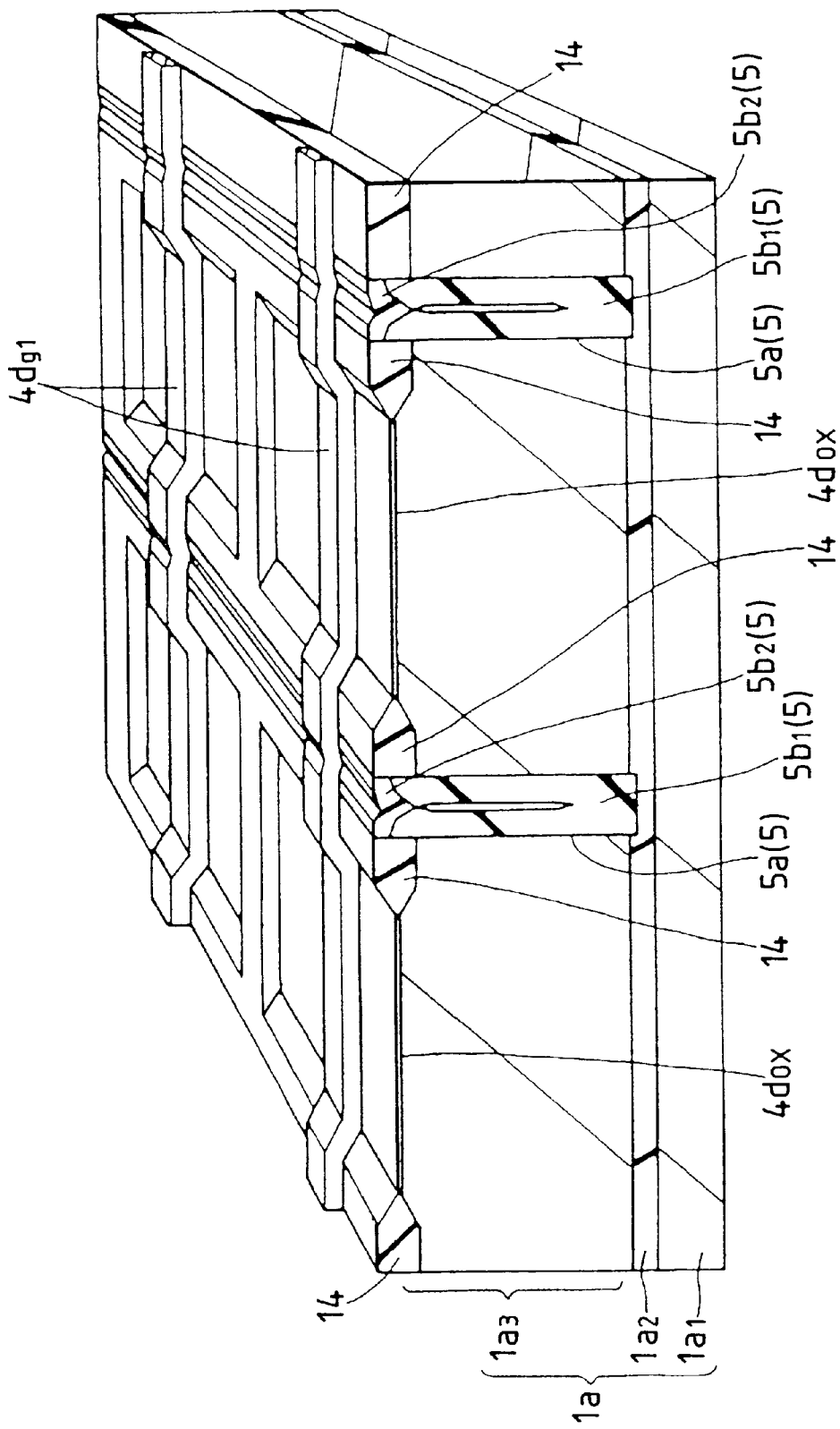
FIG. 17 is a perspective view of an essential portion of the semiconductor substrate in a step of FIG. 16, of making the semiconductor integrated circuit device of the first embodiment of this invention.
Figure 18:
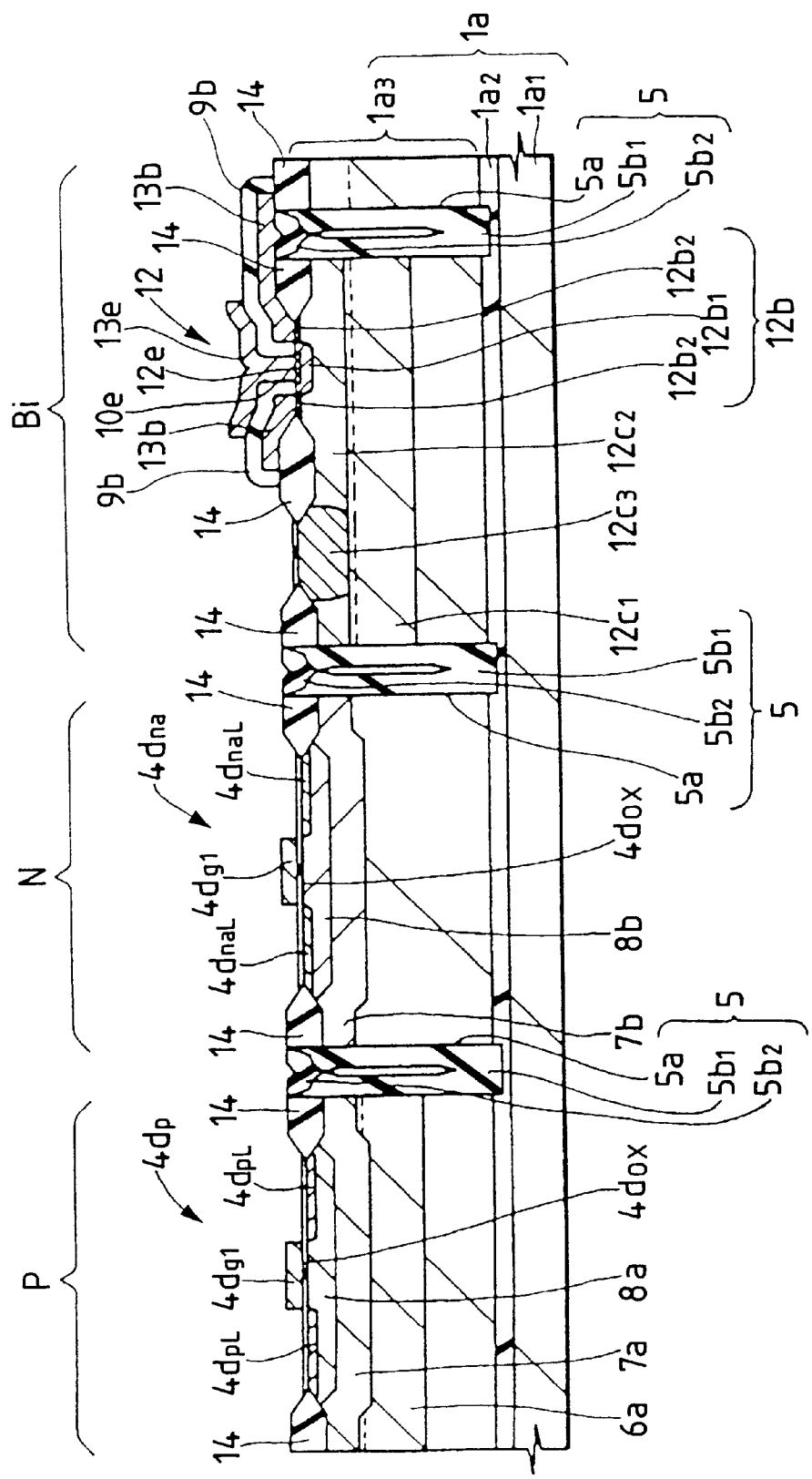
FIG. 18 is a cross section of an essential portion of the semiconductor substrate in a step, following the step of FIG. 16, of making the semiconductor integrated circuit device of the first embodiment of this invention.

FIG. 1 is an overall plan view showing a semiconductor chip making up a semiconductor integrated circuit device of a first embodiment of this invention. FIG. 2 is a plan view of an essential portion of the semiconductor chip of FIG. 1. FIG. 3 is a circuit of a memory cell forming the semiconductor integrated circuit device of FIG. 1. FIG. 4 is a cross section of an essential portion of the semiconductor integrated circuit device of FIG. 1. FIGS. 5 to 10 are cross sections of an essential portion of the semiconductor substrate in the steps of making the semiconductor integrated circuit device of the first embodiment of this invention. FIG. 11 is a graph showing the ratio of the rate of depositing an insulating film in a groove having tapered portion to that on a planar portion. FIGS. 12 to 16 are cross sections of an essential portion of the semiconductor substrate in the manufacturing steps, following the step of FIG. 10. FIG. 17 is a perspective view of an essential portion of the semiconductor substrate in the manufacturing step of FIG. 16. FIG. 18 is a cross section of an essential portion of the semiconductor substrate in a manufacturing step following the step of FIG. 16.

The semiconductor integrated circuit device of the embodiment 1 is a composite gate array comprising a logic circuit region and a memory circuit region, both formed on a single semiconductor chip. A plan view of the semiconductor chip of the embodiment 1 is shown in FIG. 1.

On the periphery of a semiconductor chip 1 is arranged an input/output circuit region 2, in which is formed input/output circuit including, e.g., an input buffer circuit and an output buffer circuit.

This input/output circuit is the one for transforming input signals from external devices into signals that can be used by internal circuits formed in the semiconductor chip 1 and for amplifying signals from the internal circuits so that they can be transmitted to external devices through long transmission lines. The input/output circuit is electrically connected to external devices through a plurality of CCB (Controlled Collapse Bump) electrodes 2a arranged in the input/output circuit region 2.

At the center of the semiconductor chip 1 is arranged a logic circuit region 3, in which is arranged an input/output circuit region 3a that extends laterally of FIG. 1, dividing the logic circuit region 3 into the upper and lower parts. Further in this logic circuit region 3, input/output circuit regions 3b extending vertically in FIG. 1 are arranged at specified intervals. These input/output circuit regions 3a, 3b divide the logic circuit region 3 into 10 sections.

In the logic circuit region 3 divided by the input/output circuit regions 3a, 3b, there are provided a plurality of logic circuit blocks 3c, in each of which are arranged, for example, an ECL (Emitter Coupled Logic) circuit drivable at high speed and a CMOS (Complementary MOS) circuit drivable with low power consumption.

In FIG. 1, memory circuit regions 4 are arranged above and below the logic circuit region 3. In each of the memory circuit regions 4, there is provided a periphery circuit region and input/output circuit region 4a that extend laterally in FIG. 1, dividing the memory circuit regions 4 into upper and lower parts. Each of the memory circuit regions 4 also has periphery circuit regions and input/output circuit regions 4b arranged at specified intervals. These input/output circuit regions 4a, 4b divide each memory circuit region 4 into, for instance, eight memory mats 4c.

Though not shown, CCB electrodes 2a are also formed in the input/output circuit regions 3a, 3b, 4a, 4b, and the input/output circuits formed on the inner side of the semiconductor chip 1 are connected to external devices through the CCB electrodes 2a.

Further, CCB electrodes 2a are also arranged on the logic circuit blocks 3c and the memory mats 4c and used for power supply and as dummy electrodes. That is, the CCB electrodes 2a are arranged in array on the semiconductor chip 1.

Each of the memory mats 4c includes a plurality of memory cells (not shown in FIG. 1). The plan view and circuit diagram of this memory cell are shown in FIG. 2 and 3, respectively.

A memory cell 4d is an SRAM (Static RAM) cell formed basically of a flip-flop circuit and comprises, for example, two p-channel MOSFETs (simply referred to as pMOSs) 4dp and four n-channel MOSFETs (simply referred to as nMOSs) 4dna, 4dnb.

The pMOS 4dp is a MOSFET forming a flip-flop circuit and has a pair of semiconductor regions 4dpL, 4dpL making up source and drain regions and a gate electrode 4dg1 arranged over the area between these semiconductor regions 4dpL, 4dpL.

The paired semiconductor regions 4dpL of the pMOS 4dp are doped, for example, with boron of p-type impurity. One of the semiconductor regions 4dpL of the pMOS 4dp is electrically connected to a power supply potential Vcc through a power supply line.

The NMOS 4dna is a MOSFET forming a flip-flop circuit and has a pair of semiconductor regions 4dnaL, 4dnaL making up source and drain regions and a gate electrode 4dg1 arranged over the area between these semiconductor regions 4dnaL, 4dnaL. The gate electrode 4dg1 is commonly used with the above-mentioned gate electrode for the pMOS 4dp.

The paired semiconductor regions 4dnaL of the nMOS 4dna are doped, for example, with phosphorus or arsenic of n-type impurity. One of the semiconductor regions 4dnaL of the nMOS 4dna is electrically connected to a ground potential Vss through a power supply line.

In an element isolation region between the pMOS 4dp and the nMOS 4dna is arranged a trench isolation 5 described later. In embodiment 1, by using the trench isolation 5 for the element isolation, it is possible to reduce the interval between the PMOS and nMOS, which is conventionally some 2.5 μm to ensure the latchup resistance, down to about 1.2 μm.

The nMOS 4dnb is a MOSFET for switching and has a pair of semiconductor regions 4dnbL, 4dnbL making up source and drain regions and a gate electrode 4dg2 arranged over the area between these semiconductor regions 4dnbL, 4dnbL. This gate electrode 4dg2 is a part of a word line 4W and is commonly used for two nMOSs 4dna, 4dnb.

The paired semiconductor regions 4dnbL of the nMOS 4dnb are doped, for example, with phosphorus or arsenic of n-type impurity. One of the semiconductor regions 4dnbL of the nMOS 4dnb is electrically connected to a bit line 4B. The other semiconductor region 4dnbL of the nMOS 4dnb is electrically connected to the semiconductor regions 4dpL, 4dnaL of the pMOS 4dp and the NMOS 4dna.

A cross section of an essential portion of the semiconductor integrated circuit device of embodiment 1 is shown in FIG. 4. A semiconductor substrate 1a forming the semiconductor chip 1 has, for example, an SOI (silicon-on-insulator) structure consisting, for example, of a support substrate 1a1, an insulating layer 1a2 formed on the support substrate 1a1, and a semiconductor layer 1a3 formed on the insulating layer 1a2.

The support substrate 1a1 is formed, for instance, of monocrystalline silicon. The insulating layer 1a2 is made of, say, silicon dioxide ($SiO_2$) and has a thickness of, e.g. about 0.5 $\mu$m to 1 $\mu$m thick. The semiconductor layer 1a3 is made of an n-type monocrystalline silicon and its upper portion is an epitaxial layer. The thickness of the semiconductor layer 1a3 is, for instance, about 2 $\mu$m and the thickness of the epitaxial layer is, for example, about 1 $\mu$m.

In the semiconductor layer 1a3, in the pMOS forming region P the pMOS 4dp is formed. In the semiconductor layer 1a3 in the pMOS forming region P, a buried region 6a, a channel stopper region 7a and an element region 8a, in the order from the bottom.

In to the buried region 6a, for example, antimony of n-type impurity is introduced. The channel stopper region 7a and the element region 8a are doped, for instance, with phosphorus or arsenic of n-type impurity.

The paired semiconductor regions 4dpL of the pMOS 4dp are formed in the device region 8a. The gate electrode 4dg1 is formed over the area between the paired semiconductor regions 4dpL through a gate insulating film 4dox. The paired semiconductor regions 4dpL are electrically connected to electrodes 11a through connecting holes 10a made in an insulating film 9a. The gate insulating film 4dox and the insulating film 9a are formed, for example, of silicon dioxide. The electrodes 11a are made from an alloy based on aluminum, such as Al-Si-Cu alloy (Al: 98.5–97.5 wt. %, Si: 1–2 wt. %, Cu: 0.5 wt. %).

In an nMOS forming region N of the semiconductor layer 1a3, the nMOS 4dna is formed. In the semiconductor layer 1a3 of the nMOS forming region N, a channel stopper region 7b and a device region 8b in order from the bottom. The channel stopper region 7b and the device region 8b are doped with boron of p-type impurity, for example.

The paired semiconductor regions 4dnaL of the nMOS 4dna are formed in the device region 8b. The gate electrode 4dg1 is formed over the area between the paired semiconductor regions 4dnaL through the gate insulating film 4dox. The paired semiconductor regions 4dnaL are electrically connected to electrodes 11b through connecting holes 10b made in the insulating film 9a. The electrodes 11b are made, for example, of an Al-Si-Cu alloy.

In the semiconductor layer 1a3, in a bipolar transistor forming region Bi an npn-type bipolar transistor 12 that, for instance, makes up the above-mentioned ECL circuit is provided.

In the semiconductor layer 1a3 in the bipolar transistor forming region Bi, a collector buried region 12c1, a collector region 12c2 and a collector leadout region 12c3 are formed.

The collector buried region 12c1 is doped with antimony of n-type impurity, for example. The collector region 12c2 and the collector leadout region 12c3 are doped with phosphorus or arsenic of n-type impurity. The collector leadout region 12c3 is electrically connected to collector electrodes 11c through connecting holes 10c in the insulating film 9a. The collector electrodes 11c are made, for example, of an Al-Si-Cu alloy.

On the collector region 12c2 is formed a base region 12b, which consists of an intrinsic base region 12b1 at the center of the collector region and a base leadout region 12b2 at the periphery. The base region 12b is doped with boron of p-type impurity.

The base leadout region 12b2 is electrically connected to a base leadout electrode 13b, which is made of a p-type polycrystalline silicon and electrically connected to a base electrode lid through a connecting hole 10d made in the insulating films 9a, 9b. The base electrode 11d is made of an Al-Si-Cu alloy, for instance.

On the intrinsic base region 12b1 is formed an emitter region 12e, which is doped with phosphorus or arsenic of an n-type impurity. The emitter region 12e is electrically connected to an emitter leadout electrode 13e through a connecting hole 10e formed in the insulating film 9b.

The emitter leadout electrode 13e is formed of an n-type polycrystalline silicon, for example, and is electrically connected to an emitter electrode 11e through a connecting hole 10f formed in the insulating film 9a. The emitter electrode 11e is made, for instance, of an Al-Si-Cu alloy. The insulating film 9a is formed of a BPSG (Boron Doped Phospho-Silicate Glass). The insulating film 9b is formed of $SiO_2$.

A field insulating film 14 and a trench isolation 5 are formed between the pMOS 4dp and the NMOS 4dna and between the nMOS 4dna and the bipolar transistor 12.

The field insulating film 14 is made of $SiO_2$, for instance. The trench isolation 5 is formed by burying, from the bottom, a buried insulating film (first insulating film) 5b1 and a buried insulating film (second insulating film) 5b2, both formed of $SiO_2$, in a deep groove 5a formed at a position of the field insulating film 14.

The upper surface of the upper buried insulating film 5b2 in the deep groove 5a is almost flush with the upper surface of the field insulating film surrounding the groove 14. The deep groove 5a has an aspect ratio larger than 1 and is deep enough to reach the insulating layer 1a2 of the semiconductor substrate 1a.

Next, referring to FIGS. 5 to 18, the method of manufacturing the semiconductor integrated circuit device of embodiment 1 will be described. In embodiment 1, a BiCMOS (Bipolar Complementary MOS) process is taken as an example.

Figure 5:
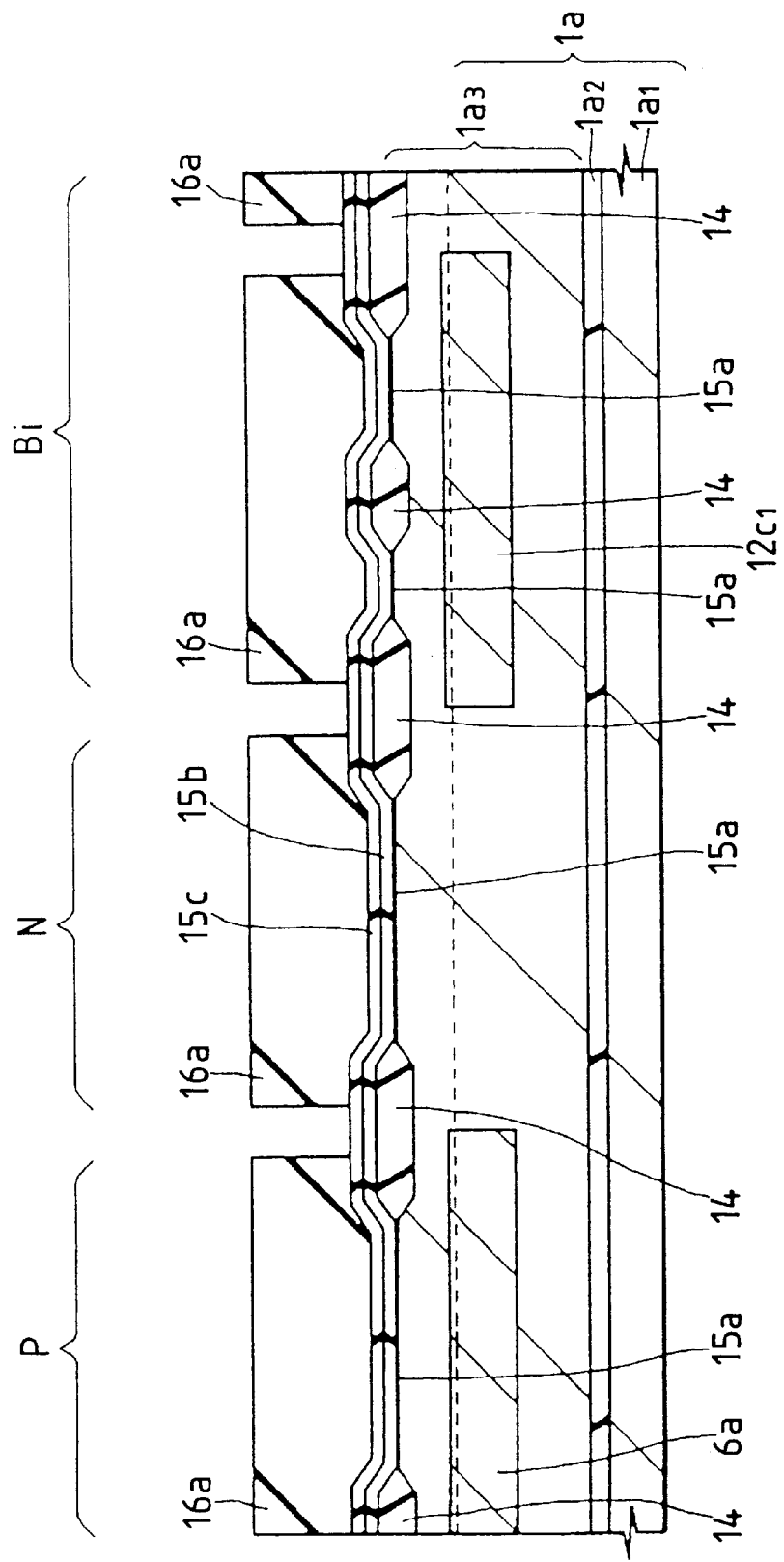
FIG. 5 is a cross section of an essential portion of the semiconductor substrate in a step of making the semiconductor integrated circuit device of the first embodiment of this invention.

FIG. 5 is a cross section of an essential portion of the semiconductor substrate 1a in a step of making the semiconductor integrated circuit device of embodiment 1. The semiconductor substrate 1a of embodiment 1 has an SOI (silicon-on-insulator) structure comprising a support substrate 1a1, an insulating layer 1a2 formed on the support substrate 1a1, and a semiconductor layer 1a3 formed on the insulating layer 1a2.

The support substrate 1a1 is made of for instance, a monocrystalline silicon. The insulating layer 1a2 is formed of silicon dioxide and for example, is 0.5–1 $\mu$m thick.

The semiconductor layer 1a3 is formed of an n-type monocrystalline silicon and its upper portion (above the dashed line) is an epitaxial layer. The semiconductor layer 1a3 is about 2 $\mu$m thick and the epitaxial layer about 1 $\mu$m thick.

In the semiconductor layer 1a3, in the pMOS forming region P and the bipolar transistor forming region Bi, a buried region 6a and a collector buried region 12c1 are formed, respectively.

The buried region 6a and the collector buried region 12c1 are doped, for instance, with antimony (Sb) of n-type impurity, whose concentration is about $1\times10^{19} cm^{-3}$. The buried region 6a and the collector buried region 12c1 are formed simultaneously by thermal diffusion, for example.

Over the epitaxial layer in the element isolation region or in the intra-element isolation region, the field insulating film 14 is formed by a LOCOS method. The field insulating film 14 is made of $SiO_2$, for example, and its thickness is about 4,000 Å. In the element forming region is formed an insulating film 15a which is made, for instance, of $SiO_2$.

Over the field insulating film 14 and the insulating film 15a are deposited an insulating film 15b of, say, silicon nitride ($Si_3N_4$) by a CVD (Chemical Vapor Deposition) method. The insulating film 15b is a film that functions as an etching stopper as described later and its thickness is about 1,000 Å.

Over the insulating film 15b is deposited an insulating film 15c of PSG (Phospho Silicate Glass) by a method. The thickness of the insulating film 15c is about 2,000 Å.

Over the insulating film 15c is so formed a photoresist pattern 16a that a part of the top portion of the element isolation field insulating film 14 is exposed. The photoresist pattern 16a is formed by an ordinary photolithography. That is, the photoresist pattern 16a is formed by applying a photoresist film and then exposing and developing the photoresist film.

Figure 6:
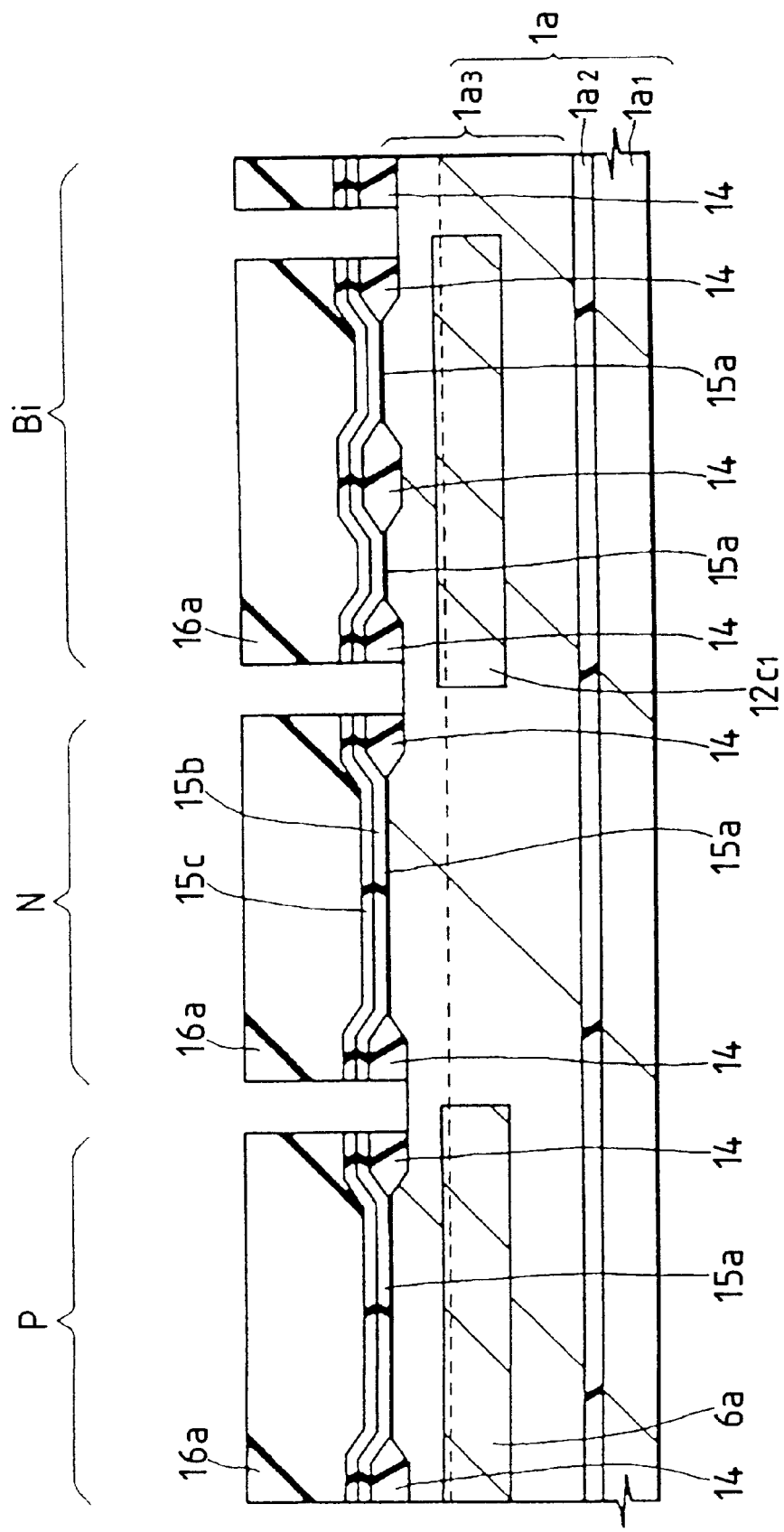
FIG. 6 is a cross section of an essential portion of the semiconductor substrate in a step, following the step FIG. 5, of making the semiconductor integrated circuit device of the first embodiment of this invention.

By performing an anisotropic etch, such as reactive ion etching using a reactive fluorine-based gas, of the semiconductor substrate 1a with the photoresist pattern 16a as an etching mask, the insulating films 15b, 15c and the field insulating film 14, exposed from the photoresist pattern 16a, are etched away. The cross section of an essential portion of the semiconductor substrate 1a after being etched is shown in FIG. 6.

Next, the photoresist pattern 16a is ashed away, after which the semiconductor substrate 1a is subjected to an anisotropic etching such as a reactive ion etching using a reactive chlorine-based gas with the insulating films 15b, 15c as an etching mask.

Figure 7:
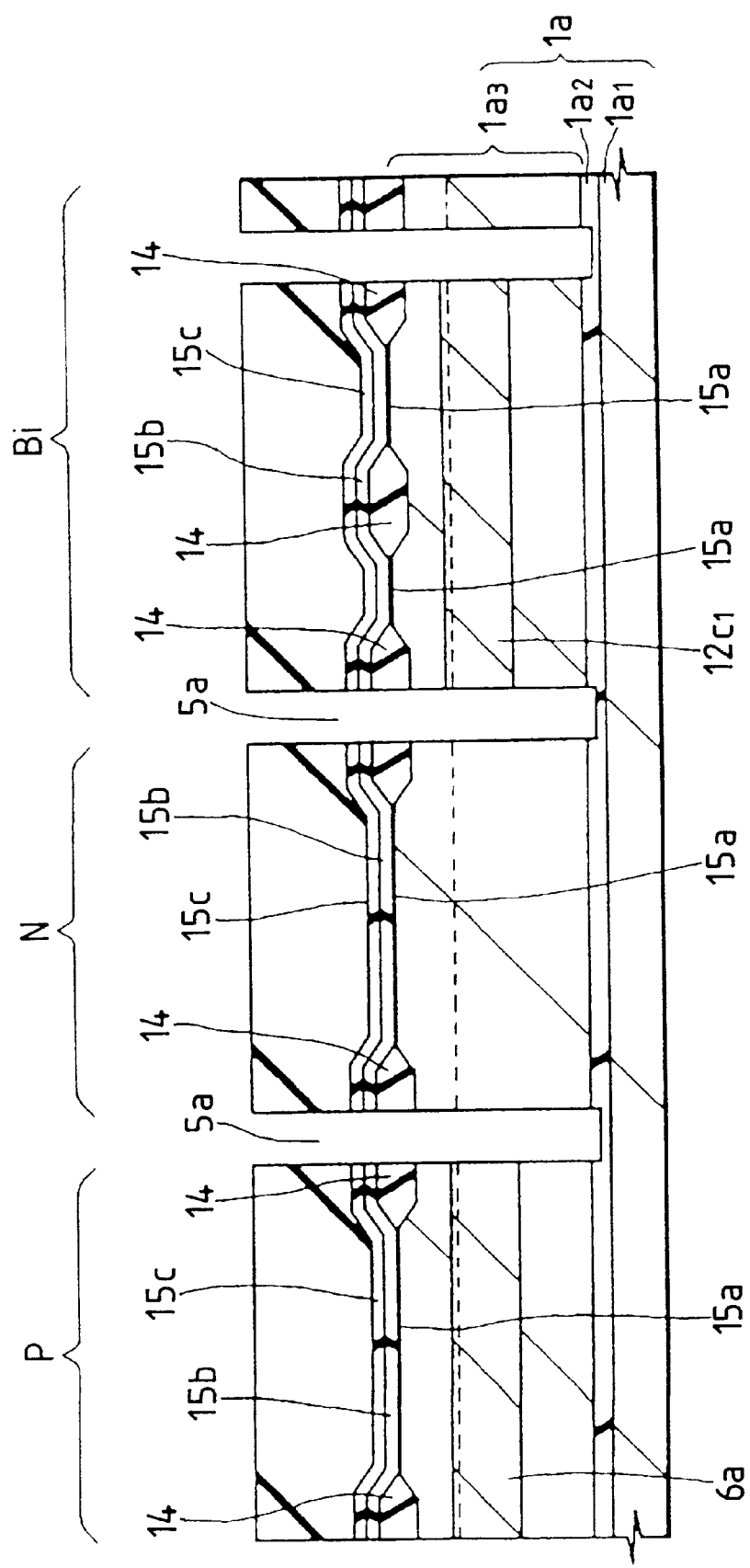
FIG. 7 is a cross section of an essential portion of the semiconductor substrate in the step, following the step of FIG. 6, of making the semiconductor integrated circuit device of the first embodiment of this invention.

Because the etch rate of the semiconductor layer 1a3 is about 30 times as high that of the insulating film 15c, the portion of the semiconductor layer 1a3 that is exposed from the insulating films 15b, 15c are etched away. Then, as shown in FIG. 7, in the semiconductor layer 1a3 are formed the deep grooves 5a that reach the insulating layer 1b2. The deep groove 5a has a depth of about 3 $\mu$m and a width of about 0.5 $\mu$m.

Figure 8:
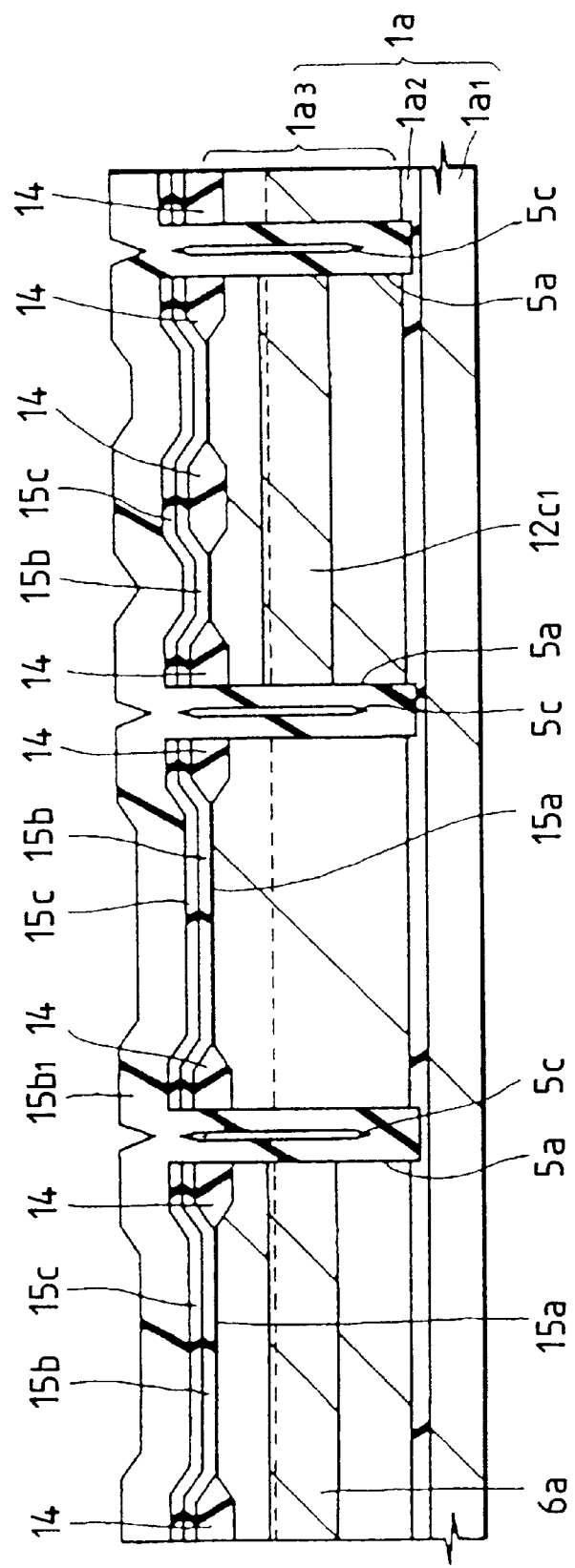
FIG. 8 is a cross section an essential portion of the semiconductor substrate in a step, following the step of FIG. 7, of making the semiconductor integrated circuit device of the first embodiment of this invention.

Then, as shown in FIG. 8, a buried insulating film (first insulating film) 5b1 of non-doped $SiO_2$ is deposited over the semiconductor substrate 1a by a CVD to fill the deep groove 5a with the buried insulating film 5b1. The thickness of the buried insulating film 5b1 is about 5,000 Å.

Because the coverage of the buried insulating film 5b1 is low at about 0.8, the central part of the deep groove 5a is not completely filled, leaving a cavity 5c. The cavity 5c extends from near the bottom of the deep groove 5a to around the upper surface of the field insulating film 14.

Next, the semiconductor substrate 1a is subjected to a reactive ion etching to etch away the buried insulating film 5b1 and the underlying insulating film 15c deposited over the semiconductor substrate 1a.

In this step, the insulating film 15b under the insulating film 15c functions as an etching stopper, which stops the etching of the semiconductor substrate 1a at the surface of the insulating film 15b.

Figure 9:
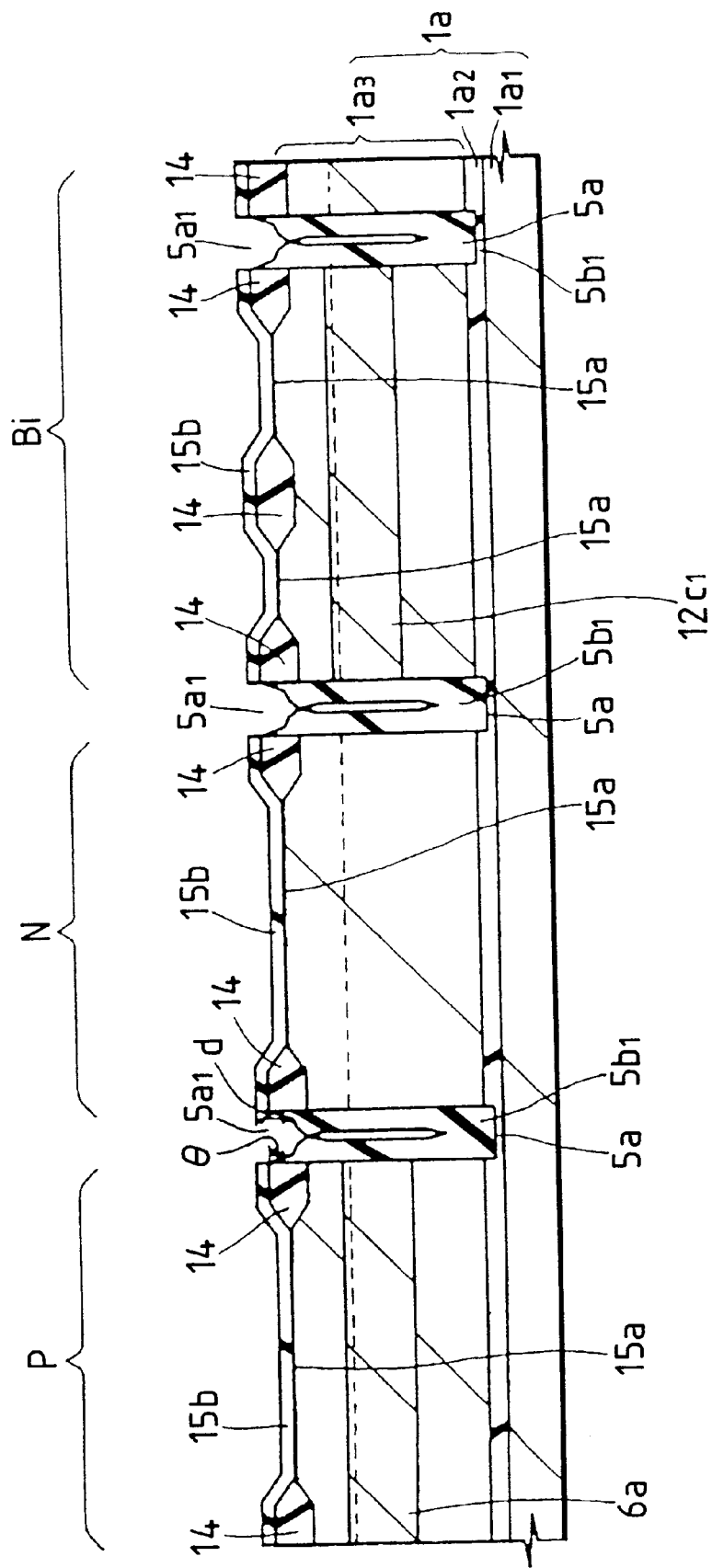
FIG. 9 is a cross section of an essential portion of the semiconductor substrate in a step, following the step of FIG. 8, of making the semiconductor integrated circuit device of the first embodiment of this invention.

In the region where the deep groove 5a is formed, however, because the insulating film 15b is partly removed, the etching progresses into the deep groove 5a. Thus, the upper part of the buried insulating film 5b1 in the deep groove 5a is etched away. Hence, as shown in FIG. 9, a shallow groove 5a1 with a depth d of about 1,500 Å is formed in the deep groove 5a.

The bottom portion of the shallow groove 5a1 is located within the thickness of the field insulating film 14. As shown in FIG. 28, a recess 5d is formed in an upper central portion of the buried insulating film 5b1 in the deep groove 5a. The recess formed at the upper central portion of the buried insulating film 5b1 in the deep groove 5a is intended to maintain at the central portion of the shallow groove 5a1 a certain thichkness of the buried insulating film described later, which fills the shallow groove 5a1.

In the cases where a cavity 5c is formed in the central part of the buried insulating film 5b1, if the insulating film buried in the shallow groove 5a1 is not made sufficiently thick at the center of the shallow groove, a large recess may be formed at the center of the insulating film buried in the shallow groove 5a1 or a groove may be formed there which communicates with the cavity 5c, making it impossible to completely fill the deep groove 5a.

The inner wall surface of the shallow groove 5a1 is tapered by the buried insulating film 5b1, without any special technique during the etching process. The tapered portion of the inner wall surface of the shallow groove 5a1 has an angle θ of about 70 degrees (see FIG. 28).

Figure 10:
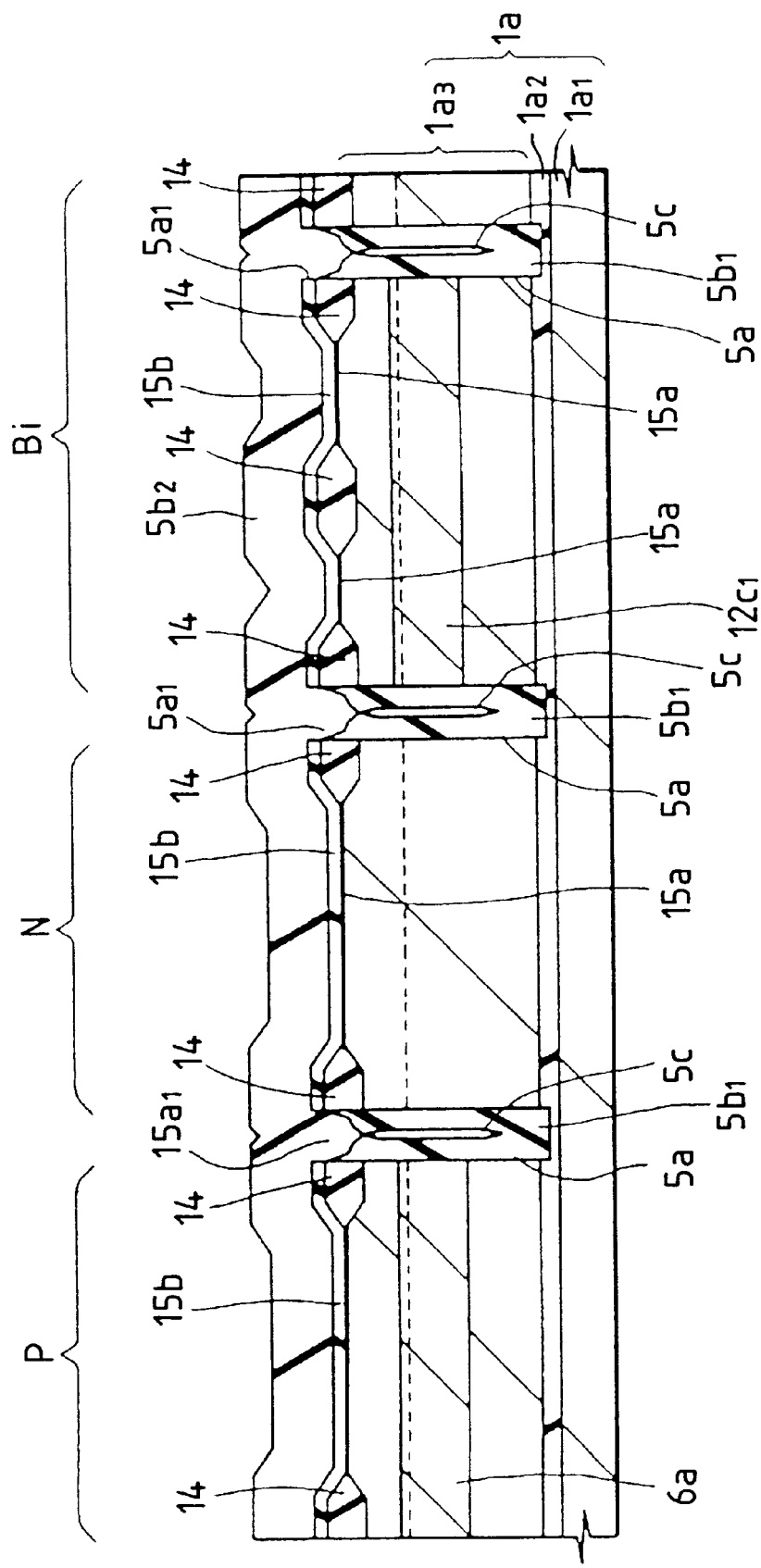
FIG. 10 is a cross section of an essential portion of the semiconductor substrate in a step, following the step of FIG. 9, of making the semiconductor integrated circuit device of the first embodiment of this invention.
Figure 11:
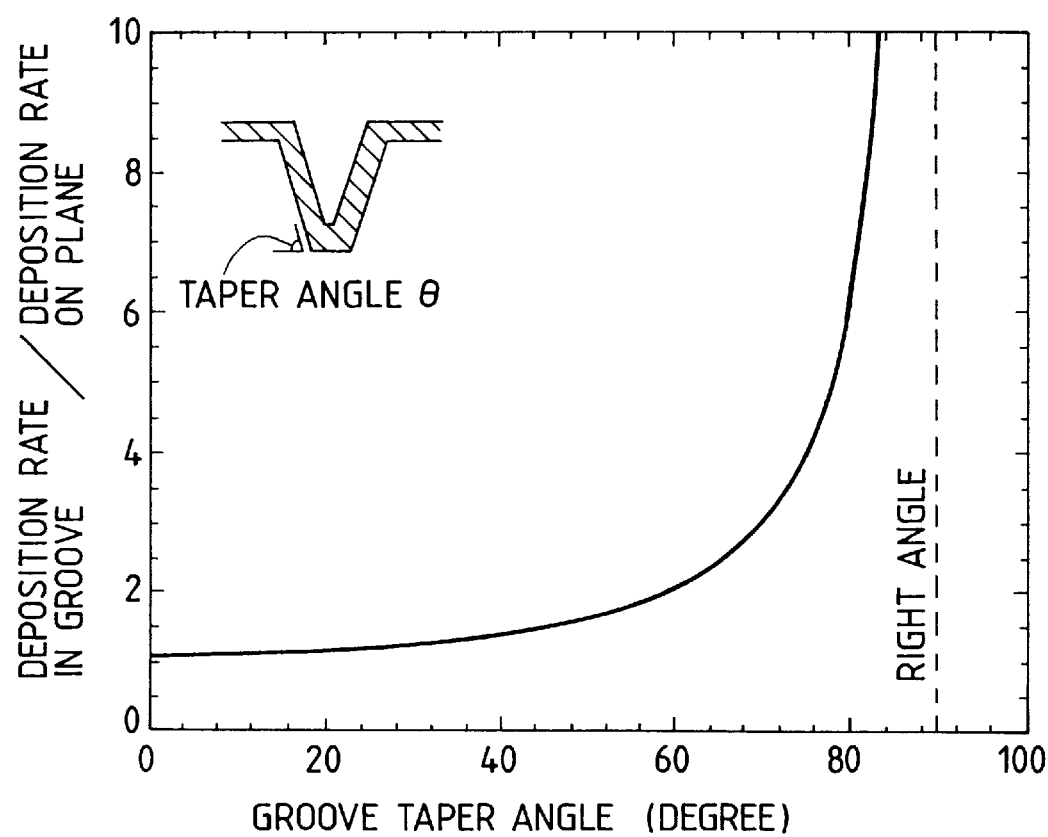
FIG. 11 is a graph showing the ratio of the rate of depositing an insulating film in a groove having a tapered portion to that on a planar portion.

Then, as shown in FIG. 10, a buried insulating film (second insulating film) 5b2 of non-doped $SiO_2$ is deposited by a CVD over the semiconductor substrate 1a to fill the shallow groove 5a1 with the buried insulating film 5b2. The thickness of the buried insulating film 5b2 is about 1,000 Å.

In this case, the buried insulating film 5b2, like the above-mentioned buried insulating film 5b1, has a low coverage but can be filled in the shallow groove 5a1 without forming a cavity for the following reasons.

First, because the shallow groove 5a1 has a low aspect ratio, and the buried insulating film 5b2 can be deposited from the bottom of the groove upward.

Second, because the tapered portion is provided to the inner wall surface of the shallow groove 5a1, and hence the buried insulating film 5b2 can be deposited properly also in the central portion of the shallow groove 5a1. When the angle θ of the tapered portion on the inner wall surface of the shallow groove 5a1 is set at around 70 degrees, the deposit condition is significantly improved.

FIG. 11 shows the dependency on the groove geometry of the ratio of an insulating film deposition rate at the bottom central portion of the shallow groove 5a1 to that of the peripheral portion. The closer the angle of the inner wall surface of the groove is to a vertical, the faster the insulating film deposition rate at the bottom central portion of the groove becomes and the coarser the film becomes. Particularly when the angle θ is greater than 85 degrees, the rate of insulating film deposition rate becomes infinite, virtually indicating the presence of a cavity in the groove.

In embodiment 1, the angle θ of the tapered portion of the inner wall surface of the shallow groove 5a1 is set to about 70 degrees. This allows the buried insulating film 5b2 to completely fill the shallow groove 5a1 without forming a cavity in the shallow groove 5a1.

Figure 12:
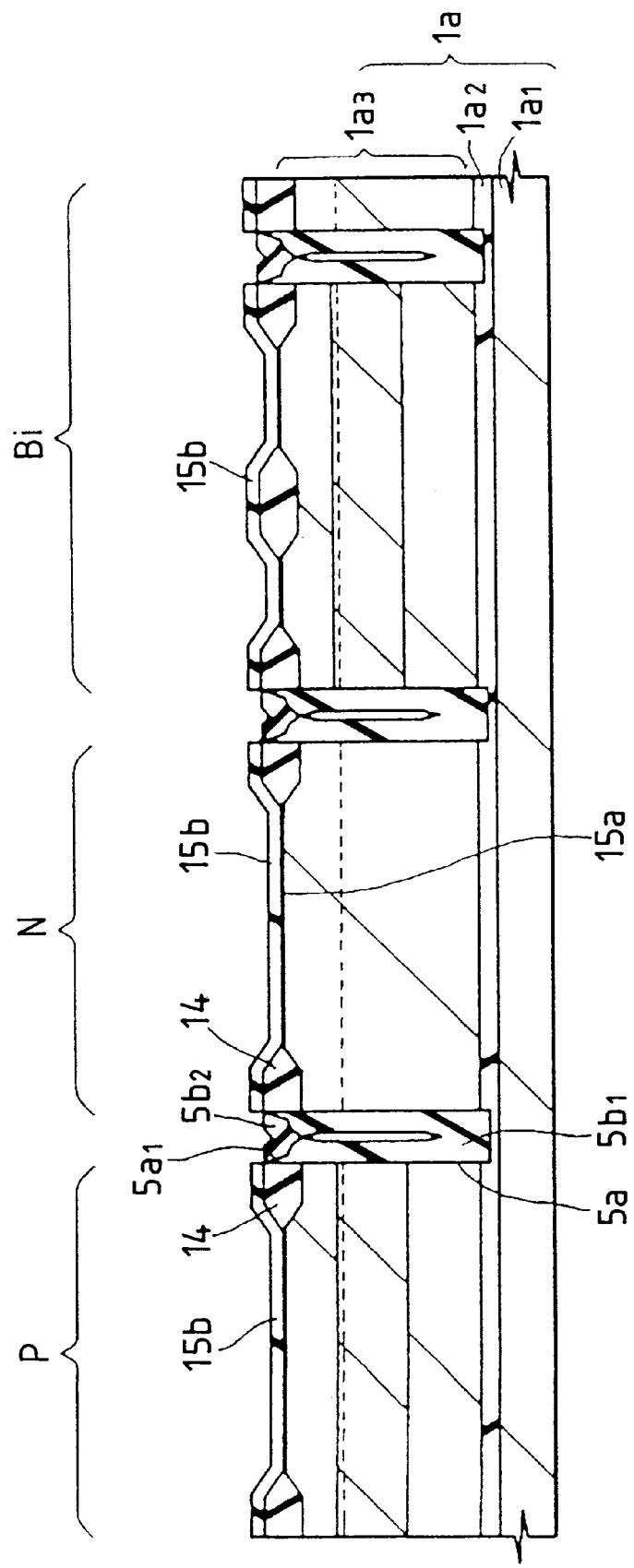
FIG. 12 is a cross section of an essential portion of the semiconductor substrate in a step, following the step of FIG. 10, of making the semiconductor integrated circuit device as a first embodiment of this invention.

The buried insulating film 5b2 is then etched back by, for example, a reactive ion etching. At this time, the underlying insulating film 15b acts as an etching stopper. As shown in FIG. 12, the etching of the semiconductor substrate 1a can be stopped at the upper surface of the insulating film 15b.

Further, in embodiment 1, by monitoring the intensity of light emitted by reaction products formed in the etching atmosphere, it is possible to stop the etching when the buried insulating film 5b2 on the insulating film 15b is completely removed.

This makes it possible to prevent overetching in the shallow groove 5a1. As a result, the upper surface of the buried insulating film 5b2 in the shallow groove 5a1 can be almost flush with the upper surface of the field insulating film 14 surrounding the shallow groove 5a1.

After the deep groove 5a is filled with the buried insulating films 5b1, 5b2 to form the trench isolation 5 in the above steps, the insulating film 15b which functions as an etching stopper is removed. The cross section of an essential portion of the semiconductor substrate 1a after being subjected to this processing is shown in FIG. 13.

Figure 13:
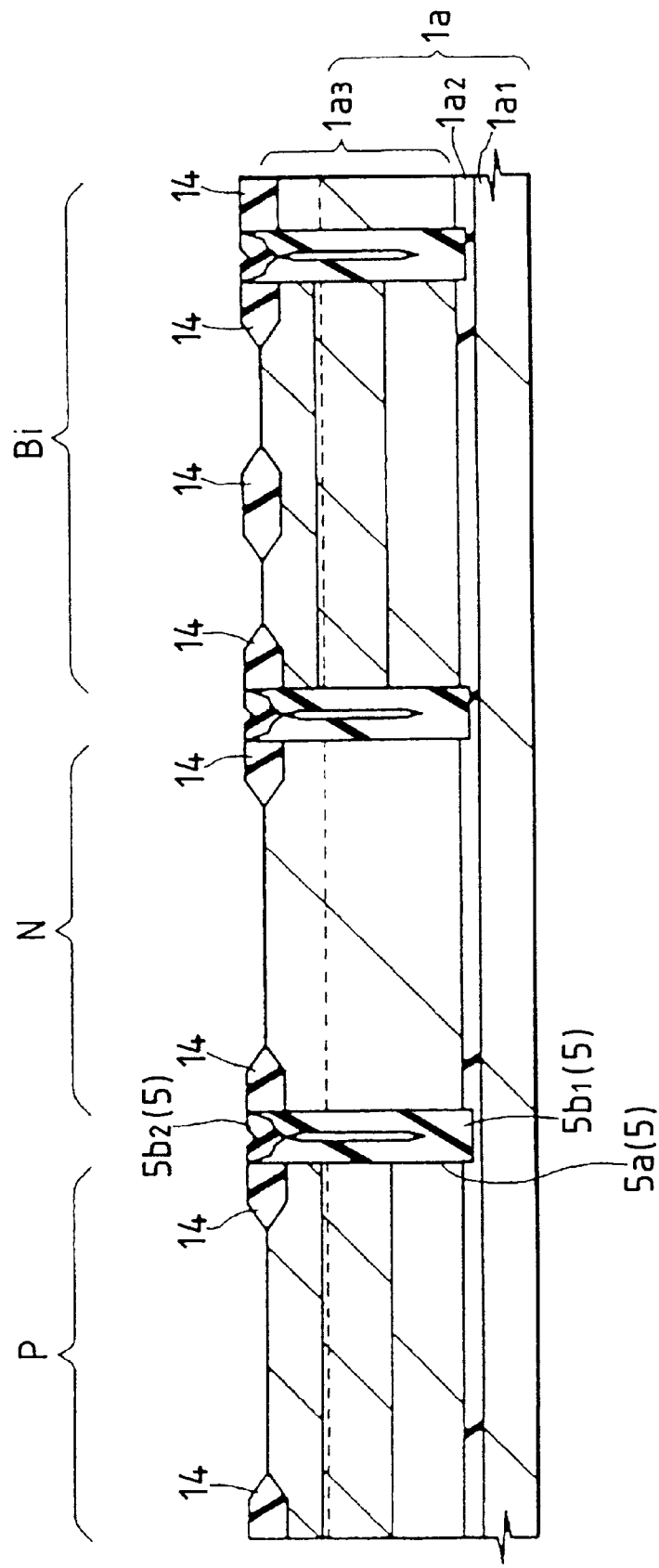
FIG. 13 is a cross section of an essential portion of the semiconductor substrate in a step, following the step of FIG. 12, of making the semiconductor integrated circuit device of the first embodiment of this invention.

In embodiment 1, as shown in FIG. 13, the deep groove 5a can be filled with the buried insulating films 5b1, 5b2 without exposing a cavity from the top of the deep groove 5a and without forming a recess in the top. The upper surface of the buried insulating film 5b2 can be made flat and almost flush with the upper surface of the surrounding field insulating film 14.

In embodiment 1, therefore, because the conductive films deposited in the subsequent steps do not remain on the surface of the trench isolation 5, short-circuit between adjacent conductor patterns caused by the residual conductive film remaining on the trench isolation 5 can be prevented.

Next, the step of fabricating the PMOS 4dp, nMOS 4dna and bipolar transistor 12 in the element forming region enclosed by the trench isolation 5 will be described referring to FIGS. 14 to 18.

Figure 14:
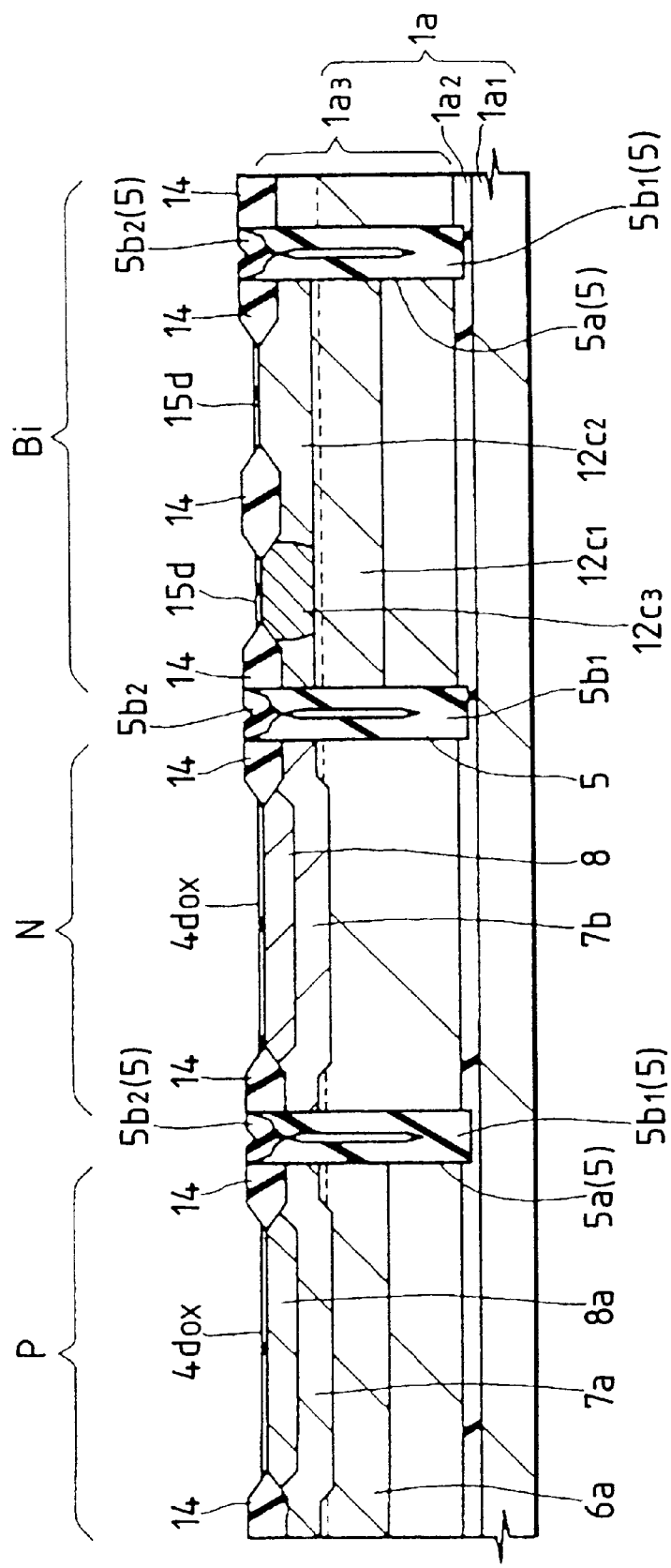
FIG. 14 is a cross section of an essential portion of the semiconductor substrate in a step, following the step of FIG. 13, of making the semiconductor integrated circuit device of the first embodiment of this invention.

FIG. 14 shows a cross section of an essential portion of the semiconductor substrate 1a after the trench isolation 5 is formed. In the semiconductor layer 1a3 of the PMOS forming region P, a channel stopper region 7a is formed over the buried region 6a.

The channel stopper region 7a is doped with phosphorus or arsenic of n-type impurity by ion implantation. The implanting energy is about 150 KeV and the surface impurity concentration is about $5 \times 10^{12}$ cm$^{-2}$.

Over the channel stopper region 7a is formed an n-type element region 8a, whose impurity concentration is so set that a specified threshold voltage can be obtained.

In the semiconductor layer 1a3 of the nMOS forming region N is formed a channel stopper region 7b, which is doped with boron of p-type impurity by ion implantation. The implanting energy is about 40 KeV and the surface impurity concentration is about $1 \times 10^{12}$ cm$^{-2}$.

Over the channel stopper region 7b is formed a p-type element region 8b, whose impurity concentration is so set that a specified threshold voltage can be obtained.

In the semiconductor layer 1a3 of the bipolar transistor forming region Bi, a collector leadout region 12c3 is formed over the collector buried region 12c1.

The collector leadout region 12c3 is formed by ion implantation, and the ion implanting energy is about 80 KeV. The surface impurity concentration of the region is about $1 \times 10^{16}$ cm$^{-2}$.

The upper surface of the semiconductor substrate 1a is subjected to thermal oxidation to form a gate insulating film 4dox and an insulating film 15d, both formed of $SiO_2$, over the semiconductor layer 1a3 enclosed by the field insulating film 14. Then, as shown in FIG. 15, over the semiconductor substrate 1a is deposited by CVD a semiconductor film 17a of polycrystalline silicon, whose thickness is about 2,000 Å.

Thereafter a photoresist pattern 16b is formed over the semiconductor film 17a by photolithography. Then, with the photoresist pattern 16b as a mask the semiconductor film 17a is patterned to form a gate electrode 4dg1, as shown in FIG. 16.

Then, the photoresist pattern 16b is ashed away. A perspective view of an essential portion of the semiconductor substrate 1a after the gate electrode 4dg1 is formed is shown in FIG. 17. In embodiment 1, because the upper surface of the deep groove 5a is planar, the semiconductor film 17a for forming the gate electrode does not remain over the deep groove 5a. It is therefore possible to prevent short-circuit between adjacent gate electrodes 4dg1 which would be caused by residual matters of the semiconductor film 17a.

Next, according to the normal MOSFET forming process, the semiconductor regions 4dpL, 4dnaL for source and drain are formed in a self-alignment manner on both sides of each gate electrode 4dg1 of the MOSFET to form the pMOS 4dp and nMOS 4dna, as shown in FIG. 18.

Then, according to the bipolar transistor forming process, a base region 12b, a base leadout electrode 13b, an emitter region 12e, an insulating film 9b and an emitter leadout electrode 13e are formed to fabricate the bipolar transistor 12.

The base region 12b comprises an intrinsic base region 12b1 and a base leadout region 12b2, both doped with, e.g. boron of p-type impurity. The base leadout electrode 13b is made of, for instance, a p-type polycrystalline silicon. The emitter leadout electrode 13e is formed of an n-type polycrystalline silicon. The insulating film 9b is made of $SiO_2$, for instance, to electrically isolate the emitter leadout electrode 13e and the base leadout electrode 13b from each other.

Then, as shown in FIG. 4, the insulating film 9a of, say, BPSG is deposited on the semiconductor substrate 1a, which is then subjected to a heat treatment at, say, around 900° C. to planarize the upper surface of the insulating film 9a. The thickness of the insulating film 9a is about 1 μm.

Next, in the insulating film 9a, connecting holes 10a–10f that reach the semiconductor regions 4dpL, 4dnaL, the collector leadout region 12c3, the emitter leadout electrode 13e and the base leadout electrode 13b are made. After this, a metal film of, say, an Al-Si-Cu alloy is deposited over the insulating film 9a by sputtering.

This is followed by the patterning of the metal film by, e.g. dry etching to form the electrodes 11a, 11b, emitter electrode 11e, collector electrode 11c and base electrode 11d simultaneously.

Then, the pMOS 4dp and the nMOS 4dna are electrically connected through interconnecters to form the memory cell. The bipolar transistor 12 is used to form a peripheral circuit and an ECL circuit of the memory circuit region. In such a way, the semiconductor integrated circuit device is fabricated.

Embodiment 1 has the following advantages.

(1) When the deep groove 5a for a trench isolation having a high aspect ratio is filled, the filling step is divided into two steps. In the first step the deep groove 5a is filled to a specified extent to lower the aspect ratio of the deep groove 5a and thereby transform the deep groove 5a into a shallow groove 5a1. In the second step the shallow groove 5a1 is filled and the top portion of the buried material in the shallow groove 5a1 is planarized. Consequently, it is possible to satisfactorily fill the deep groove 5a of a high aspect ratio without exposing a cavity from the top of the deep groove 5a, without forming a recess at the top periphery of the deep groove 5a, and without incurring a significant increase in the number of manufacturing steps.

(2) By forming a recess in the top central portion of the buried insulating film 5b1 in the deep groove 5a, it is possible to ensure a sufficient thickness of the buried insulating film 5b2 filled between the central portion of the top surface of the buried insulating film 5b1 and the top surface of the shallow groove 5a1. Hence, if a cavity is formed in the center of the buried insulating film 5b1, it is possible to prevent a large recess due to the cavity or a groove communicating with the cavity from being formed in the center of the overlying buried insulating film 5b2.

(3) By forming a tapered portion in the opening of the deep groove 5a, the buried insulating film 5b2 can be buried into the shallow groove 5a1 without forming a cavity.

(4) Because of the above items (1) to (3), no recess nor cavity is formed in the top of the trench isolation 5, making it possible to prevent short-circuit between the gate electrodes 4dg1, which would be caused by a gate electrode forming polycrystalline silicon film remaining in the recess and the cavity. It is therefore possible to improve the yield and reliability of the semiconductor integrated circuit device.

Embodiment 2

FIGS. 19 through 27 are cross sections of an essential portion of the semiconductor substrate in a step of fabricating the semiconductor integrated circuit device of a second embodiment of this invention.

In embodiment 1, description was made of a case where the buried material for filling the deep groove in the semiconductor substrate is $SiO_2$. However, the buried material is not limited to this material and may be selected from a variety of materials.

In embodiment 2, description will be made of a case where a polycrystalline silicon is used as the deep groove filling material with reference to FIGS. 19 to 27.

Figure 19:
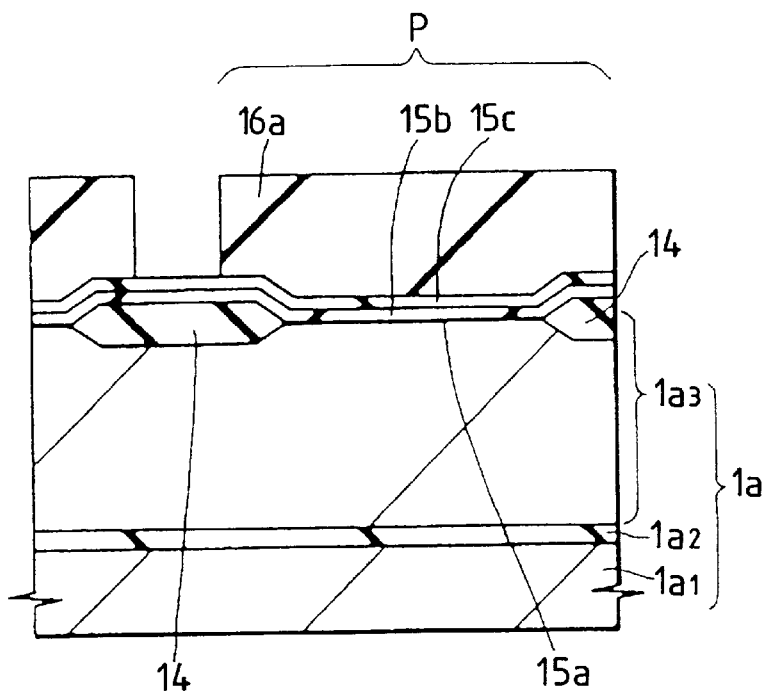
FIG. 19 is a cross section of an essential portion of the semiconductor substrate in a step of making the semiconductor integrated circuit device of a second embodiment of this invention.

First, as shown in FIG. 19, a photoresist pattern 16a is formed over the semiconductor substrate 1a by photolithography. At the opening of the photoresist pattern 16a a part of the top surface of the insulating film 15c above the element isolation field insulating film 14 is exposed. The width of the opening in the photoresist pattern 16a is about 0.5 $\mu$m.

Figure 20:
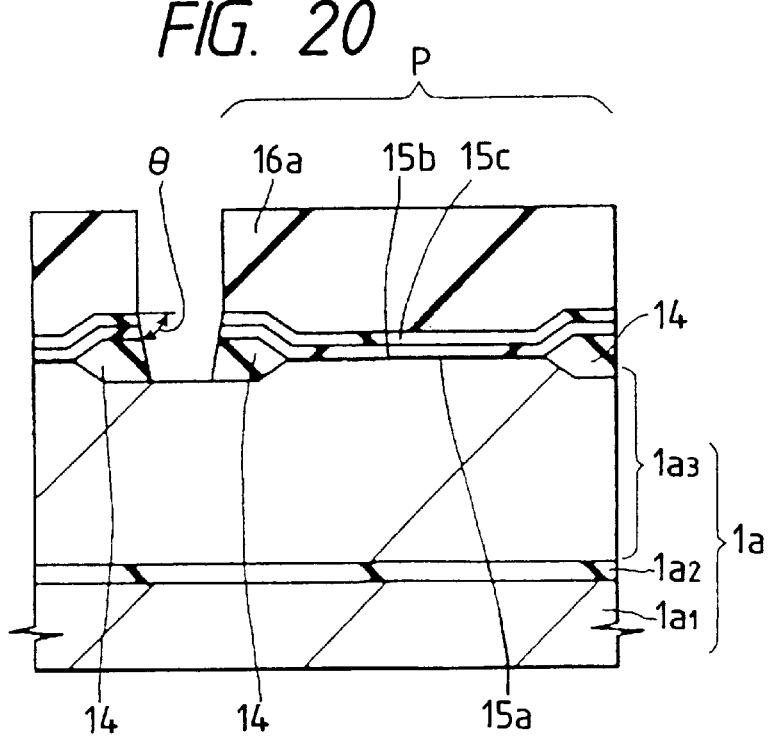
FIG. 20 is a cross section of an essential portion of the semiconductor substrate in a step, following the step of FIG. 19, of making the semiconductor integrated circuit device of the second embodiment of this invention.

Next, with the photoresist pattern 16a as an etching mask, the insulating films 15b, 15c and the field insulating film 14 that are exposed from the photoresist pattern 16a are etched away, as shown in FIG. 20, by anisotropic etching using a gas mixture of $CH_2F_2$ and $CF_4$.

In this step, a tapered portion is formed on the inner wall surface of the opening in the field insulating film 14. In forming this tapered portion the proportion of $CH_2F_4$ in the gas mixture used in the etching is increased.

Increasing the proportion of $CH_2F_4$ results in an increase in the proportion of carbon in a plasma, making it easier for reaction products including carbon to adhere to the inner wall surface of the opening in the field insulating film 14, thereby forming the tapered portion on the inner wall surface. The angle $\theta$ of the tapered portion is set at, say, around 70 degrees as in embodiment 1.

Then, the photoresist pattern 16a is ashed away, and the semiconductor substrate 1a is subjected to anisotropic etching, such as reactive ion etching using a reactive chlorine gas, with the insulating film 15c as an etching mask.

Figure 21:
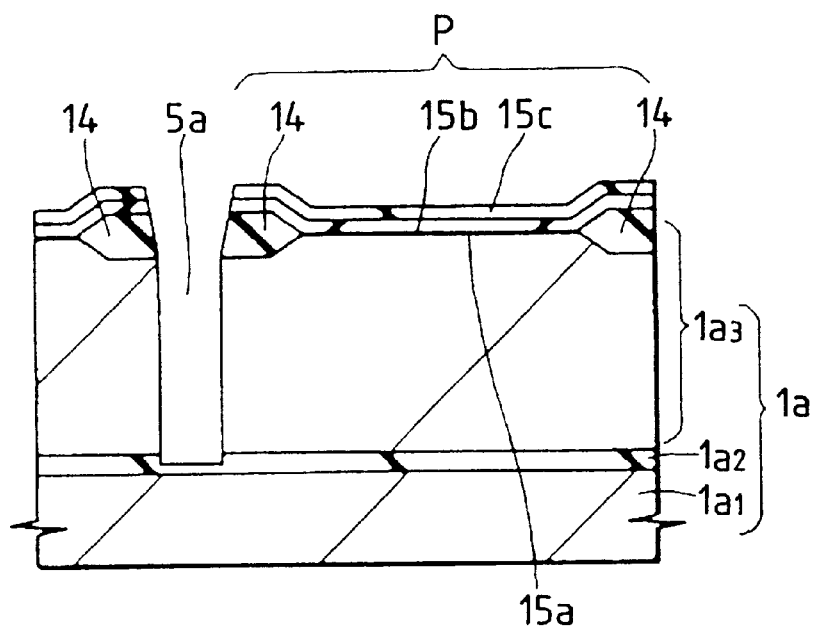
FIG. 21 is a cross section of an essential portion of the semiconductor substrate in a step, following the step of FIG. 20, of making the semiconductor integrated circuit device of the second embodiment of this invention.

Because the etching rate of the semiconductor layer 1a3 is about 30 times as high as that of the insulating film 15c, the semiconductor layer 1a3 that are exposed from the insulating film 15c are etched away. Then, as shown in FIG. 21, in the semiconductor layer 1a3 deep grooves 5a that reach the insulating layer 1b2 are formed. The deep groove 5a has a depth of, for example, about 3 $\mu$m.

Figure 22:
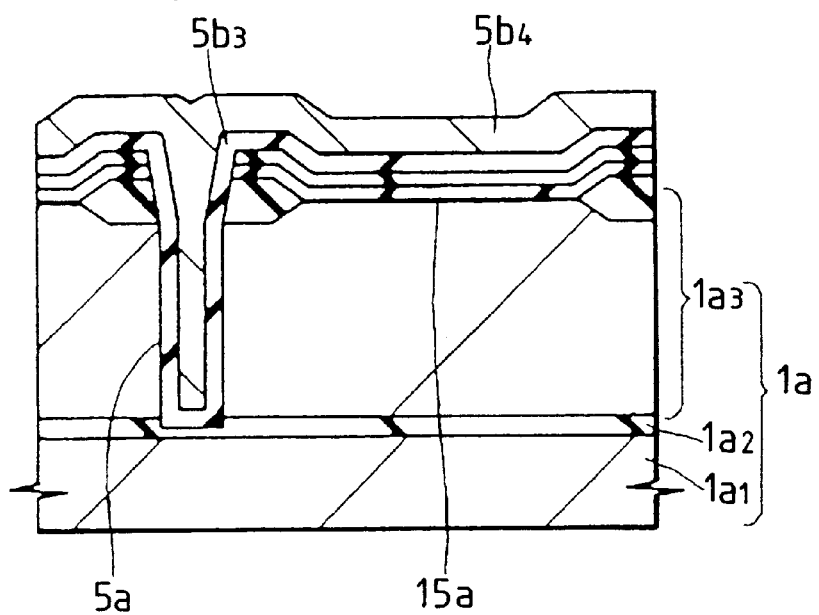
FIG. 22 is a cross section of an essential portion of the semiconductor substrate in a step, following the step of FIG. 21, of making the semiconductor integrated circuit device of the second embodiment of this invention.

Next, as shown in FIG. 22, a buried insulating film 5b3 of, say, $SiO_2$ is deposited over the semiconductor substrate 1a by CVD. Then, a buried semiconductor film 5b4 of, say, polycrystalline silicon is deposited over the buried insulating film 5b3 by CVD to fill the deep groove 5a. The thickness of the buried insulating film 5b3 is about 2,000 Å and that of the buried semiconductor film 5b4 is about 4,000 Å.

Then, the buried semiconductor film 5b4 is etched back. At this time, allowing the buried insulating film 5b3 below the buried semiconductor film 5b4 to function as an etch stopper, the etching of the semiconductor substrate 1a can be stopped at the upper surface of the buried insulating film 5b3.

Figure 23:
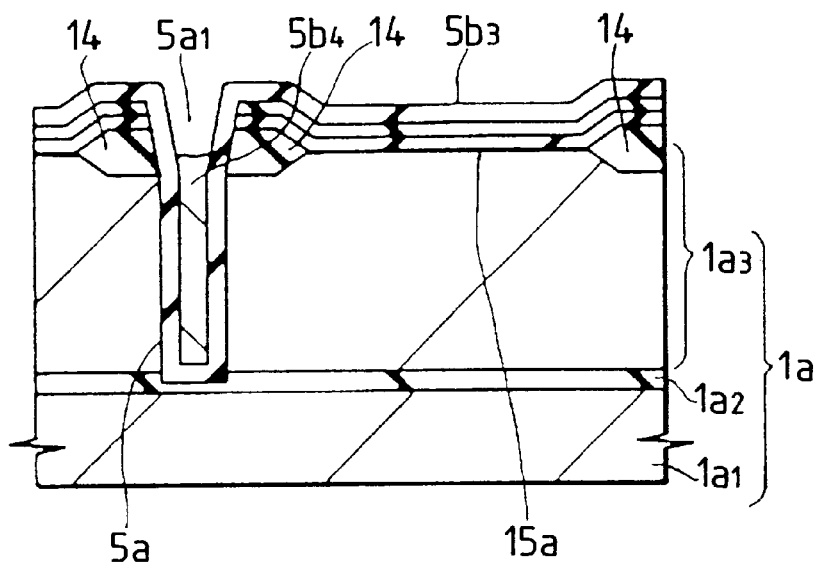
FIG. 23 is a cross section of an essential portion of the semiconductor substrate in a step, following the step of FIG. 22, of making the semiconductor integrated circuit device of the second embodiment of this invention.

In the region where the deep groove 5a is formed, however, the etching progresses, the upper portion of the buried semiconductor film 5b4 in the deep groove 5a is etched away. Hence, as shown in FIG. 23, a shallow groove 5a1 about 1,000 Å deep can be formed in the deep groove 5a.

Figure 24:
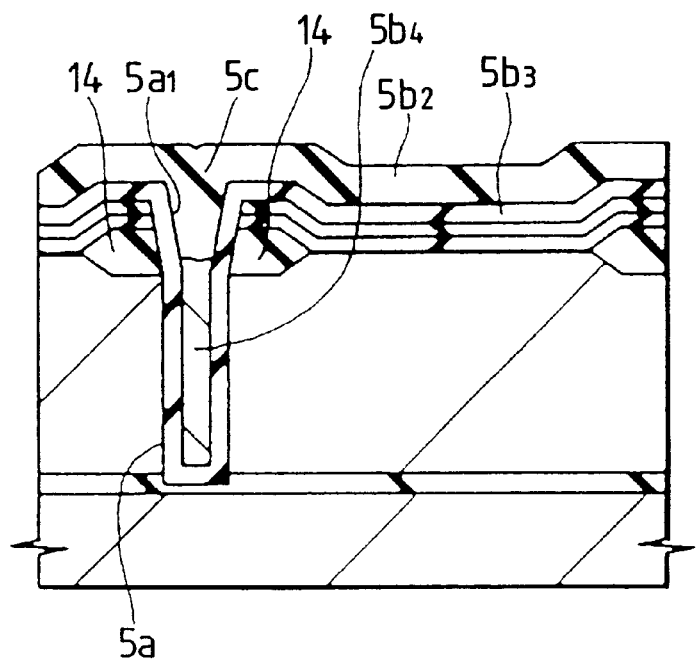
FIG. 24 is a cross section of an essential portion of the semiconductor substrate in a step, following the step of FIG. 23, of making the semiconductor integrated circuit device of the second embodiment of this invention.

Then, as shown in FIG. 24, a buried insulating film (second insulating film) 5b2 of, say, non-doped $SiO_2$ is deposited by CVD over the semiconductor substrate 1a to bury the buried insulating film 5b2 in the shallow groove 5a1. The thickness of the buried insulating film 5b2 is about 5,000 Å.

At this time, the buried insulating film 5b2, too, has a low coverage, but can satisfactorily fill the shallow groove 5a1 for the following reasons.

First, because the shallow groove 5a1 has a low aspect ratio, and the buried insulating film 5b2 can be deposited from the bottom of the groove. Second, because the tapered portion is provided to the inner wall surface of the shallow groove 5a1, and the buried insulating film 5b2 can be satisfactorily deposited also in the central portion of the shallow groove 5a1. Particularly cavity 5c formed in the buried insulating film 5b2 is located higher than the upper surface of the field insulating film 14, and accordingly does not affect the subsequent processes.

Further, in embodiment 2, because the buried insulating film 5b2 is deposited over the buried semiconductor film 5b4, there is no need to oxidize the upper part of the buried semiconductor film 5b4 in the deep groove 5a.

Then, the buried insulating film 5b2 is etched backed by, e. g. reactive ion etching.

Figure 25:
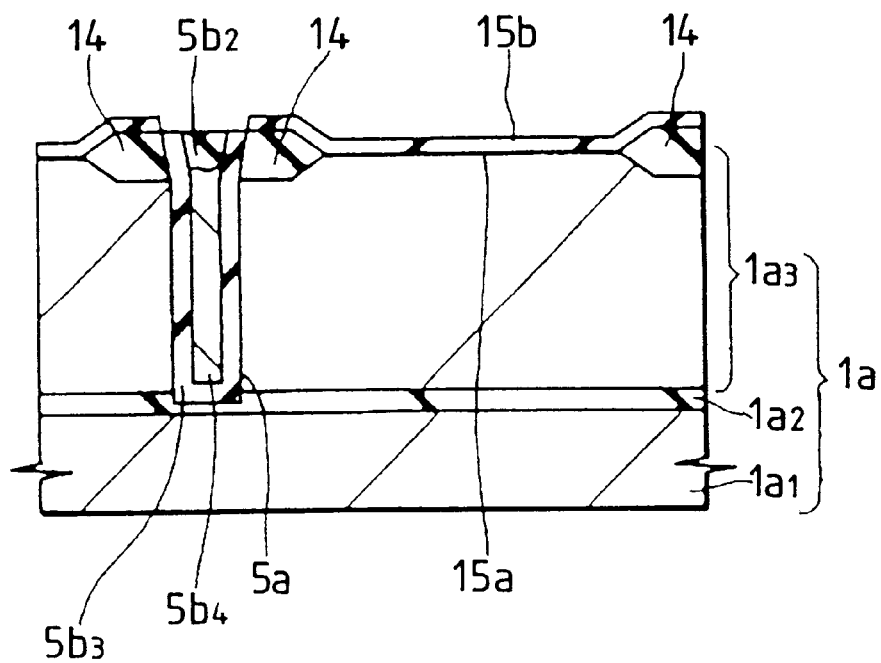
FIG. 25 is a cross section of an essential portion of the semiconductor substrate in a step, following the step of FIG. 24, of making the semiconductor integrated circuit device of the second embodiment of this invention.

At this time, the insulating film 15b underlying the buried insulating film 5b2 functions as an etching stopper. Thus, as shown in FIG. 25, the etching of the semiconductor substrate 1a can be stopped at the upper surface of the insulating film 15b.

Further, in embodiment 2, by monitoring the intensity of light emitted by reaction products formed in the etching atmosphere during this process, it is possible to stop the etching when all the buried insulating film 5b2 on the insulating film 15b is removed.

This makes it possible to prevent overetch in the shallow groove 5a1. As a result, the upper surface of the buried insulating film 5b2 in the shallow groove 5a1 can be almost flush with the upper surface of the field insulating film 14 surrounding the shallow groove 5a1.

After the deep groove 5a is filled with the buried semiconductor film 5b4 and the buried insulating films 5b2, 5b3 to form the trench isolation 5 in the above processes, the insulating film 15b, which functions as an etching stopper, is removed. The cross section of an essential portion of the semiconductor substrate 1a after this processing is shown in FIG. 26.

Figure 26:
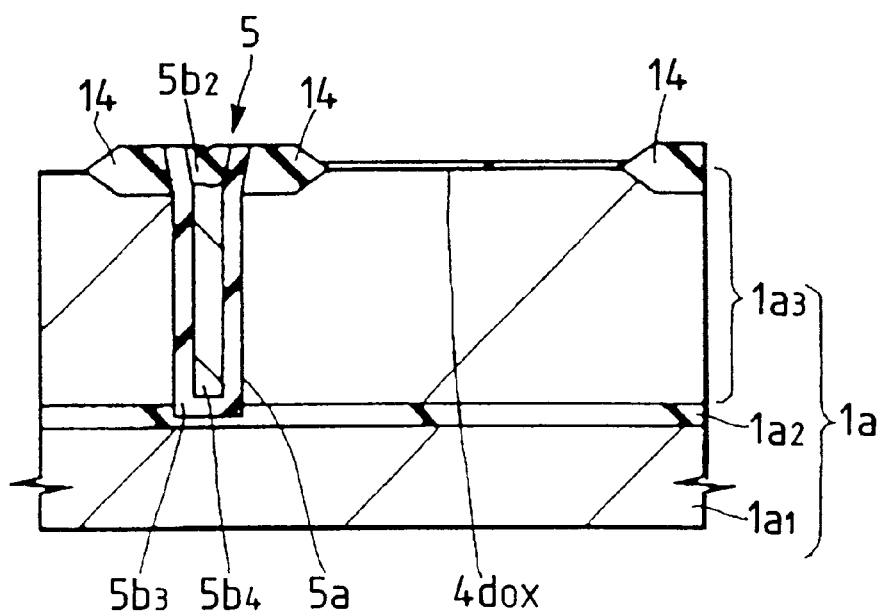
FIG. 26 is a cross section of an essential portion of the semiconductor substrate in a step, following the step FIG. 25, of making the semiconductor integrated circuit device of the second embodiment of this invention.

In such a way, in embodiment 2, too, the deep groove 5a can be filled with the buried semiconductor film 5b4 and the buried insulating films 5b2, 5b3, as shown in FIG. 26, without forming a cavity in the upper part of the deep groove 5a. It is also possible to ensure a planar surface at the top of the buried insulating film 5b2 and to make the upper surface of the buried insulating film 5b2 almost flush with the upper surface of the field insulating film 14.

Hence, also in embodiment 2, because undesired conductive films remain on the surface of the trench isolation 5, in the subsequent processes short-circuit between adjacent conductive patterns due to the remaining conductive films can be prevented.

Then, as in embodiment 1, according to a normal MOSFET forming process, the pMOS 4dp is formed on the semiconductor layer, as shown in FIG. 27.

In such a way, embodiment 2 has the similar advantages to those of embodiment 1.

The present invention has been described in connection with the preferred embodiments. It should be noted, however, that this invention is not limited to these embodiments and that various modifications may be made without departing the gist of the invention.

While in the embodiments the etching stopper film is made of silicon nitride, other materials may be used. For example, polycrystalline silicon may be used. In this case the thickness of the polycrystalline silicon is about 1,000 Å.

In embodiment 2, when the tapered portion is formed in the opening of the deep groove, the proportion of the reactive gas $CH_2F_4$ used during the etching process for forming the deep groove is increased. The method of forming the tapered portion is not limited to this method and may be any other method. For instance, isotropic etching may be used for forming the deep groove. It is also possible to lower the etching selectivity of the field insulating film to the photoresist for forming the deep groove.

By this technique, the field insulating film portion under the photoresist pattern, too, can be etched away during the etching for forming the deep groove, thus forming a tapered portion in the opening in the field insulating film.

Although the above description was made of a case where the present invention is applied to a composite gate array, the field of application which is the background of this invention, there are a variety of possible applications. This invention can be applied to, for example, an ordinary gate array having only logic circuits, and to other types of semiconductor integrated circuit devices such as logic circuits and semiconductor memories fabricated by an ordinary fabrication method.

Representatives of this invention disclosed by this patent application will be briefly summarized as follows.

(1) By a method of manufacturing a semiconductor integrated circuit device according to this invention, when the deep groove for a trench isolation having a high aspect ratio is filled, the filling process is divided into two steps. In the first step the deep groove is filled to a specified extent to lower the aspect ratio of the deep groove and thereby transform the deep groove into a shallow groove. In the second step, the shallow groove is filled and the top portion of the buried material in the shallow groove is planarized. By this filling technique, it is possible to satisfactorily fill the deep groove of a high aspect ratio without exposing a cavity from the top of the deep groove, without forming a recess at the top periphery of the deep groove, and without incurring a significant increase in the number of manufacturing steps.

Because short-circuit defect between conductive patterns, which would be caused by presence of residual conductor film in a recess or cavity formed in the upper part of the trench isolation, can be prevented during a step of forming conductor patterns after the trench isolation is formed, it is possible to improve the yield and reliability of the semiconductor integrated circuit device.

(2) By a method of manufacturing a semiconductor integrated circuit device according to this invention, by forming a recess at the top central portion of a first insulating film buried in the deep groove, it is possible to ensure a sufficient thickness of a second insulating film filled between the central portion of the top surface of the first insulating film and the top surface of the shallow groove. Hence, if a cavity is formed in the center of the first insulating film, it is possible to prevent a large recess due to the cavity or a groove communicating with the cavity from being formed in the center of the second insulating film.

(3) By a method of manufacturing a semiconductor integrated circuit device according to this invention, by forming a tapered portion in the opening of the deep groove, the second insulating film can be buried in the shallow groove without forming a cavity.

We claim:

1. A method of manufacturing a semiconductor integrated circuit device, comprising:

a step of forming a field insulating film in a semiconductor substrate having a surface;

a step of forming in the semiconductor substrate a first groove for trench isolation with an aspect ratio of greater than 1, wherein the first groove is formed through the field insulating film and into the semiconductor substrate such that a first opening portion of the first groove, through the field insulating film, is tapered, at a first angle relative to the surface of the semiconductor substrate, and the first groove has a second opening portion into the semiconductor substrate, a taper angle of the second opening portion, relative to the surface of the semiconductor substrate, being greater than the first angle;

a step of burying a first silicon oxide film in the first groove, and removing a part of the first silicon oxide film in such a way that a second groove, shallower than said first groove, with an aspect ratio of not greater than 1, remains; and after said removing a part of the first silicon oxide film, a step of burying a second silicon oxide film into the second groove, so as to fill the second groove, such that the first groove is filled with only the first and second silicon oxide films.

2. A method of manufacturing a semiconductor integrated circuit device according to claim 1, wherein the bottom of the second groove is located so as to be closer to the field insulating film than to the semiconductor substrate.

3. A method of manufacturing a semiconductor integrated circuit device according to claim 1, wherein the semiconductor substrate has a Silicon-on-Insulator structure comprising a semiconductor layer formed over an insulating layer and the first groove is so formed as to reach the insulating layer.

4. A method of manufacturing a semiconductor integrated circuit device according to claim 1, further comprising:

a step of forming a MOSFET or a bipolar transistor in an element forming region enclosed by the first groove.

5. A method of manufacturing a semiconductor integrated circuit device according to claim 1, wherein after burying the second silicon oxide film into the second groove, an upper portion of the second silicon oxide film is removed to planarize the upper surface of the second silicon oxide film buried in the second groove.

6. A method of manufacturing a semiconductor integrated circuit device according to claim 1, wherein the taper angle of the opening portion of the first groove, with respect to the surface of the semiconductor substrate, is at most 70 degrees.

7. A method of manufacturing a semiconductor integrated circuit device according to claim 2, wherein the upper surface of the second silicon oxide film is formed to be substantially flush with the upper surface of the field insulating film.

8. A method of manufacturing a semiconductor integrated circuit device according to claim 1, wherein said semiconductor integrated circuit device includes a memory cell having p-MOSFETs and n-MOSFETs, and the first groove is provided between the p-MOSFETs and the n-MOSFETs.

9. A method of manufacturing a semiconductor integrated circuit device according to claim 8, wherein each memory cell includes a flip-flop circuit of said p-MOSFETs and said n-MOSFETs.

10. A method of manufacturing a semiconductor integrated circuit device according to claim 9, wherein said memory cell is a static random access memory.

11. A method of manufacturing a semiconductor integrated circuit device according to claim 1, wherein the step of burying the first silicon oxide film includes forming a layer of material of the first silicon oxide film in the first groove and on the semiconductor substrate, and the removing a part of the first silicon oxide film includes removing the layer of material in the first groove and on the semiconductor substrate so as to provide the second groove.

12. A method of manufacturing a semiconductor integrated circuit device according to claim 11, wherein said layer of material of the first silicon oxide film is formed in the first groove and extending above the first groove.

13. A method of manufacturing a semiconductor integrated circuit device, comprising the steps of:
    forming a field insulating film in a semiconductor substrate having a surface;
    forming in the semiconductor substrate a first groove for trench isolation with an aspect ratio of greater than 1, wherein the first groove is formed through the field insulating film and into the semiconductor substrate such that a first opening portion of the first groove, through the field insulating film, is tapered, at a first angle relative to the surface of the semiconductor substrate, and the first groove has a second opening portion into the semiconductor substrate, a taper angle of the second opening portion, relative to the surface of the semiconductor substrate, being greater than the first angle, the first groove being defined by side surfaces extending downwardly from an upper surface of the field insulating film and by a bottom surface which is located at a lower level than the upper surface and is formed between the side surfaces;
    after the step of forming the first groove, forming a first silicon oxide film in the first groove and over the surface of the semiconductor substrate by deposition to bury the first groove;
    after the step of forming the first silicon oxide film, removing the first silicon oxide film over the surface of the semiconductor substrate and buried in the first groove to leave a part of the first silicon oxide film in the first groove in such a way that an upper surface of the part of the first silicon oxide film is located at a lower level than the upper surface of the field insulating film and a second groove with an aspect ratio of not greater than 1 remains over a part of the first silicon oxide film in the first groove, the second groove being relatively shallower than the first groove and being defined by the upper surface of the part of the first silicon oxide film;
    after the step of removing the first silicon oxide film, forming a second silicon oxide film over the part of the first silicon oxide film and over the surface of the semiconductor substrate by deposition to bury the second groove; and
    after the step of forming the second silicon oxide film, removing the second silicon oxide film over the surface of the semiconductor substrate to leave a part of the second silicon oxide film in the second groove.

14. A method of manufacturing a semiconductor integrated circuit device according to claim 13, wherein the semiconductor substrate has a Silicon-on-Insulator structure comprising a semiconductor layer formed over an insulating layer, and the first groove is so formed as to reach the insulating layer.

15. A method of manufacturing a semiconductor integrated circuit device according to claim 13, further comprising:
    a step of forming a MOSFET or a bipolar transistor in an element forming region enclosed by the first groove.

16. A method of manufacturing a semiconductor integrated circuit device, comprising the steps of:
    selectively forming a field insulating film in a surface of a semiconductor substrate;
    forming in the semiconductor substrate a first groove for trench isolation, with an aspect ratio of greater than 1 at the field insulating film, the first groove extending into the semiconductor substrate through the field insulating film such that a first opening portion of the first groove, through the field insulating film, is tapered, at a first angle relative to the surface of the semiconductor substrate, and the first groove has a second opening portion extending into the semiconductor substrate, a taper angle of the second opening portion, relative to the surface of the semiconductor substrate, being greater than the first angle, the first groove being defined by side surfaces extending downwardly from the surface of the field insulating film and by a bottom surface which is located at a lower level than the surface of the field insulating film and is formed between the side surfaces;
    after the step of forming the first groove, forming a first silicon oxide film in the first groove and over the surface of the semiconductor substrate including the field insulating film by deposition to bury the first groove;
    after the step of forming the first silicon oxide film, removing the first silicon oxide film over the surface of the semiconductor substrate and buried in the first groove to leave a part of the first silicon oxide film in the first groove in such a way that an upper surface of the part of the first silicon oxide film is located at a lower level than the surface of the field insulating film and a second groove with an aspect ratio of not greater than 1 remains over the part of the first silicon oxide film in the first groove, the second groove being relatively shallower than the first groove and being defined by the upper surface of the part of the first silicon oxide film;

after the step of removing the first silicon oxide film, forming a second silicon oxide film over the part of the first silicon oxide film and over the surface of the semiconductor substrate by deposition to bury the second groove; and after the step of forming the second silicon oxide film, removing the second silicon oxide film over the [upper] surface of the semiconductor substrate to leave a part of the second silicon oxide film in the second groove.

17. A method of manufacturing a semiconductor integrated circuit device, comprising the steps of:
(a) forming a field insulating film in a semiconductor substrate having a surface;
(b) forming in the semiconductor substrate a first groove for trench isolation with an aspect ratio of greater than 1, wherein the first groove is formed through the field insulating film and into the semiconductor substrate such that a first opening portion of the first groove, through the field insulating film, is tapered, at a first angle relative to the surface of the semiconductor substrate, and the first groove has a second opening portion into the semiconductor substrate, a taper angle of the second opening portion, relative to the surface of the semiconductor substrate, being greater than the first angle, the first groove being defined by side surfaces extending downwardly from an upper corner of the first groove, and a bottom surface which is located at a lower level than the upper corner and is formed between the side surfaces;
(c) after the step (b), forming a first silicon oxide film in the first groove and over the semiconductor substrate by deposition to bury the first groove;
(d) after the step (c), etching and removing the first silicon oxide film over the semiconductor substrate and buried in the first groove to leave a part of the first silicon oxide film in the first groove in such a way that an upper surface of the part of the first silicon oxide film is located at a lower level than the upper corner and a second groove with an aspect ratio of not greater than 1 remains over the part of the first insulating film in the first groove, the second groove being relatively shallower than the first groove and being defined by the side surfaces and the upper surface of the part of the first silicon oxide film, the upper surface of the part of the first silicon oxide film having a shape of a taper which is recessed in a central position thereof;
(e) after the step (d), forming a second silicon oxide film over the part of the first silicon oxide film and over the semiconductor substrate by deposition to bury the second groove; and
(f) after the step (e), etching and removing the second silicon oxide film over the surface of the semiconductor substrate to leave a part of the second silicon oxide film in the second groove.

18. A method of manufacturing a semiconductor integrated circuit device according to claim 17, wherein the depositions to form both the first and second insulating films are chemical vapor depositions.

19. A method of manufacturing a semiconductor intergrated circuit device according to claim 1, wherein the first silicon oxide film is made of non-doped silicon oxide.

20. A method of manufacturing a semiconductor integrated circuit device according to claim 1, wherein said step of burying a first silicon oxide film includes burying a first silicon oxide layer on surfaces of said groove, and burying a semiconductor layer on the first silicon oxide layer; and the removing of a part of the first silicon oxide film removes a part of the semiconductor layer.

21. A method of manufacturing a semiconductor integrated circuit device according to claim 1, wherein the step of burying the first silicon oxide film includes depositing silicon oxide in the first groove, and the step of burying the second silicon oxide film includes depositing silicon oxide into the second groove so as to fill the second groove.

22. A method of manufacturing a semiconductor integrated circuit device according to claim 21, wherein the silicon oxide is deposited in the first and second grooves by chemical vapor deposition.

23. A method of manufacturing a semiconductor integrated circuit device according to claim 1, wherein in removing the part of the first silicon oxide film, leaving a remaining part, an upper surface of the remaining part has a recess in a central portion thereof, with the second silicon oxide film being formed on the upper surface of the remaining part having the recess in the central portion thereof.

24. A method of manufacturing a semiconductor integrated circuit according to claim 13, wherein the first silicon oxide film is removed such that said upper surface of the part of the first silicon oxide film left in the first groove has a recess in a central portion thereof.

25. A method of manufacturing a semiconductor integrated circuit according to claim 16, wherein the first silicon oxide film is removed such that said upper surface of the part of the first silicon oxide film left in the first groove has a recess in a central portion thereof.

26. A method of manufacturing a semiconductor integrated circuit device according to claim 1, wherein the step of burying the first silicon oxide film in the first groove includes depositing the first silicon oxide film so as to fill the first groove.

27. A method of manufacturing a semiconductor integrated circuit device according to claim 13, wherein in the step of forming the first silicon oxide film by deposition to bury the first groove, the first silicon oxide film fills the first groove.

28. A method of manufacturing a semiconductor integrated circuit device according to claim 16, wherein in the step of forming the first silicon oxide film by deposition to bury the first groove, the first silicon oxide film fills the first groove.

29. A method of manufacturing a semiconductor integrated circuit device according to claim 17, wherein in the step of forming the first silicon oxide film by deposition to bury the first groove, the first silicon oxide film fills the first groove.

30. A method of manufacturing a semiconductor integrated circuit device, comprising steps of:
forming in a semiconductor substrate, having a surface, a first groove for trench isolation with an aspect ratio of greater than 1;
depositing a first insulating film in the first groove;
removing a part of the first insulating film, leaving a remaining first insulating film, to form a second groove in the first groove, the second groove having an aspect ratio of not greater than 1 and having a taper angle of an inner side surface of the second groove, with respect to the surface of the semiconductor substrate, which is less than 85 degrees; and
burying a second insulating film in the second groove so as to fill the second groove.

31. A method of manufacturing a semiconductor integrated circuit device according to claim 30, wherein the taper angle of the inner side surface of the second groove is at most 70 degrees.

32. A method of manufacturing a semiconductor integrated circuit device according to claim 30, further comprising the step of:

forming a field insulating film in the semiconductor substrate, and wherein the first groove is formed through the field insulating film and into the semiconductor substrate, the first groove having a first opening portion into the field insulating film and a second opening portion into the semiconductor substrate, the first groove being formed such that a taper angle of the first opening portion, with respect to the surface of the semiconductor substrate, is less than a taper angle of the second opening portion, with respect to the surface of the semiconductor substrate.

33. A method of manufacturing a semiconductor integrated circuit device according to claim 32, wherein in the first groove forming step, an etching condition is changed between etching of the field insulating film and etching of the semiconductor substrate to form the taper angle of the first opening portion to be less than the taper angle of the second opening portion.

34. A method of manufacturing a semiconductor integrated circuit device according to claim 32, wherein the first insulating film is an undoped silicon oxide film.

35. A method of manufacturing a semiconductor integrated circuit device according to claim 31, wherein the first insulating film is an undoped silicon oxide film.

36. A method of manufacturing a semiconductor integrated circuit device according to claim 30, wherein the first insulating film is an undoped silicon oxide film.

37. A method of manufacturing a semiconductor integrated circuit device, comprising steps of:

forming in a semiconductor substrate a first groove for trench isolation with an aspect ratio of greater than 1;

burying a first material in the first groove;

removing a part of the first material to form a second groove, in the first groove, having an aspect ratio of not greater than 1 and having a taper angle of an inner side surface of the second groove, with respect to the surface of the semiconductor substrate, which is less than 85 degrees; and burying a second material in the second groove such that the first groove is filled by the first and second materials.

38. A method of manufacturing a semiconductor integrated circuit device according to claim 37, wherein the taper angle of the second groove is at most 70 degrees.

39. A method of manufacturing a semiconductor integrated circuit device according to claim 37, further comprising the step of:

forming a field insulating film in the semiconductor substrate, and wherein the first groove is formed through the field insulating film and into the semiconductor substrate, the first groove having a first opening portion into the field insulating film and a second opening portion into the semiconductor substrate, the first groove being formed such that a taper angle of the first opening portion, with respect to the surface of the semiconductor substrate, is less than a taper angle of the second opening portion, with respect to the surface of the semiconductor substrate.

40. A method of manufacturing a semiconductor integrated circuit device, comprising the steps of:

forming in a semiconductor substrate a first groove for trench isolation with an aspect ratio of greater than 1;

depositing an undoped silicon oxide film in the first groove;

removing a part of the undoped silicon oxide film to leave a second groove having an aspect ratio of not greater than 1 and having a taper angle of an inner side surface of the second groove, with respect to the surface of the semiconductor substrate, which is less than 85 degrees; and burying a first insulating film in the second groove such that said first groove is filled by the undoped silicon oxide film and the first insulating film.

41. A method of manufacturing a semiconductor integrated circuit device according to claim 40, further comprising the step of:

forming a field insulating film in the semiconductor substrate, and wherein the first groove is formed through the field insulating film and into the semiconductor substrate, the first groove having a first opening portion into the field insulating film and a second opening portion into the semiconductor substrate, the first groove being formed such that a taper angle of the first opening portion, with respect to the surface of the semiconductor substrate, is less than a taper angle of the second opening portion, with respect to the surface of the semiconductor substrate.

* * * * *